(12) United States Patent
Hasumi

(10) Patent No.: US 11,997,400 B2
(45) Date of Patent: May 28, 2024

(54) IMAGING ELEMENT AND ELECTRONIC APPARATUS

(71) Applicant: SONY SEMICONDUCTOR SOLUTIONS CORPORATION, Kanagawa (JP)

(72) Inventor: Ryoji Hasumi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 66 days.

(21) Appl. No.: 17/295,511

(22) PCT Filed: Nov. 28, 2019

(86) PCT No.: PCT/JP2019/046506
§ 371 (c)(1),
(2) Date: May 20, 2021

(87) PCT Pub. No.: WO2020/116297
PCT Pub. Date: Jun. 11, 2020

(65) Prior Publication Data
US 2022/0021853 A1 Jan. 20, 2022

(30) Foreign Application Priority Data
Dec. 6, 2018 (JP) ................................. 2018-228642

(51) Int. Cl.
*H04N 25/13* (2023.01)
*H01L 27/146* (2006.01)
(Continued)

(52) U.S. Cl.
CPC ....... *H04N 25/13* (2023.01); *H01L 27/14621* (2013.01); *H04N 23/11* (2023.01); *H04N 25/704* (2023.01); *H04N 25/705* (2023.01)

(58) Field of Classification Search
CPC ...... H04N 25/13; H04N 23/11; H04N 25/704; H04N 25/705; H04N 25/134;
(Continued)

(56) References Cited

U.S. PATENT DOCUMENTS 7,656,476 B2 * 2/2010 So ..................... G02F 1/133621
349/143
2006/0043261 A1 3/2006 Matsuda et al.
(Continued)

FOREIGN PATENT DOCUMENTS

CN 103037161 A 4/2013
CN 104025584 A 9/2014
(Continued)

OTHER PUBLICATIONS

International Search Report and Written Opinion prepared by the European Patent Office dated Feb. 18, 2020, for International Application No. PCT/JP2019/046506.

*Primary Examiner* — Abdelaaziz Tissire
(74) *Attorney, Agent, or Firm* — Sheridan Ross PC

(57) ABSTRACT

An imaging device includes a first pixel group including first photoelectric conversion regions, and at least one first color filter on the first photoelectric conversion regions. The imaging device includes a second pixel group including second photoelectric conversion regions, and at least one second color filter on the second photoelectric conversion regions. The imaging device includes a dummy region between the first pixel group and the second pixel group in a first direction so that a first side of the dummy region is adjacent to the first pixel group and a second side of the dummy region is adjacent to the second pixel group.

20 Claims, 17 Drawing Sheets

(51) Int. Cl.
*H04N 23/11* (2023.01)
*H04N 25/704* (2023.01)
*H04N 25/705* (2023.01)

(58) Field of Classification Search
CPC .... H04N 23/843; H04N 23/672; H04N 25/75; H04N 19/186; H04N 23/10; H04N 9/646; H04N 25/133; H04N 19/182; H04N 25/702; H04N 19/176; H04N 25/135; H04N 13/271; H01L 27/14601; H01L 27/14605; H01L 27/1463; H01L 27/1464; H01L 27/14621; H01L 27/14645; H01L 27/14643; H01L 27/14603; H01L 27/14607; H01L 27/156; H01L 27/14649; H01L 27/14667; H01L 27/14669; G09G 2300/0452; G09G 2320/0242; G09G 3/2074; G06T 2207/10024; G06T 7/90; G06T 3/4015; G06T 2207/10048
See application file for complete search history.

(56) References Cited

U.S. PATENT DOCUMENTS

| | | | |
|---|---|---|---|
| 2008/0074520 A1 | 3/2008 | Matsuda et al. | |
| 2014/0145068 A1 | 5/2014 | Meynants | |
| 2014/0313380 A1* | 10/2014 | Aoki | H04N 23/672 348/280 |
| 2015/0244957 A1* | 8/2015 | Kim | H04N 25/134 348/302 |
| 2016/0116808 A1* | 4/2016 | Higano | G02F 1/133512 349/110 |
| 2016/0276396 A1* | 9/2016 | Tayanaka | H01L 27/14689 |
| 2016/0293873 A1 | 10/2016 | Yamaguchi | |
| 2016/0373676 A1* | 12/2016 | Zhang | H01L 27/14634 |
| 2017/0098673 A1 | 4/2017 | Nomura | |
| 2017/0127000 A1* | 5/2017 | Low | B60R 1/00 |
| 2018/0063456 A1* | 3/2018 | Lee | H01L 27/14621 |
| 2018/0197904 A1* | 7/2018 | Oh | H01L 27/1463 |
| 2018/0308915 A1* | 10/2018 | Motoyama | H10K 59/38 |
| 2019/0267415 A1 | 8/2019 | Oh et al. | |
| 2022/0150428 A1* | 5/2022 | Kido | H01L 27/14623 |
| 2022/0293031 A1* | 9/2022 | Wu | G09G 3/2003 |

FOREIGN PATENT DOCUMENTS

| | | |
|---|---|---|
| CN | 104969540 A | 10/2015 |
| EP | 2738812 | 6/2014 |
| JP | 2003009003 A | 1/2003 |
| JP | 2008541454 A | 11/2008 |
| JP | 2010512050 A | 4/2010 |
| JP | 2015130533 A | 7/2015 |
| JP | 2016052041 A | 4/2016 |
| JP | 2018-098344 | 6/2018 |
| JP | 2020-092335 | 6/2020 |
| TW | 201224565 A1 | 6/2012 |
| WO | WO-2012153533 A1 | 11/2012 |
| WO | WO-2013099637 A1 | 7/2013 |

* cited by examiner

IMAGING ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2019/046506 having an international filing date of Nov. 28, 2019, which designated the United States, which PCT application claimed the benefit of Japanese Patent Application No. 2018-228642, filed Dec. 6, 2018, the entire disclosures of each of which are incorporated herein by reference.

TECHNICAL FIELD

The present disclosure relates to an imaging element and an electronic apparatus including the imaging element.

BACKGROUND ART

The applicant has proposed an imaging element having a "Quadra" arrangement in which a plurality of pixel groups including four pixels is arranged in a Bayer arrangement (refer to PTL 1, for example). The four pixels are arranged in a two row-by-two column square arrangement, and one color filter of the same color as that of the four pixels is provided for the four pixels.

CITATION LIST

Patent Literature

[PTL 1] Japanese Unexamined Patent Application Publication No. 2018-098344

SUMMARY

Technical Problem

Such an imaging element is expected to have higher resolution.

Solution to Problem

An imaging element according to an embodiment of the present disclosure includes a plurality of first pixel groups, a plurality of second pixel groups, a plurality of third pixel groups, and a plurality of fourth pixel groups. Each of the plurality of first pixel group includes a plurality of first pixels arranged in a two-dimensional array of m first pixels in a first direction and m first pixels in a second direction, where the m is a natural number of two or more. Each of the plurality of second pixel groups includes a plurality of second pixels arranged in a two-dimensional array of m second pixels in the first direction and m second pixels in the second direction. The second pixel groups and the first pixel groups are alternately arranged in the first direction. Each of the plurality of third pixel groups includes a plurality of third pixels arranged in a two-dimensional array of m third pixels in the first direction and m third pixels in the second direction. The third pixel groups and the first pixel groups are alternately arranged in the second direction. Each of the plurality of fourth pixel groups includes a plurality of fourth pixels arranged in a two-dimensional array of m fourth pixels in the first direction and m fourth pixels in the second direction. The fourth pixel groups and the third pixel groups are alternately arranged in the first direction, and the fourth pixel groups and the second pixel groups are alternately arranged in the second direction. Herein, dimensions in the first direction of the first pixel groups, the second pixel groups, the third pixel groups, and the fourth pixel group are all substantially equal to a first dimension, and dimensions in the second direction of the first pixel groups, the second pixel groups, the third pixel groups, and the fourth pixel groups are all substantially equal to a second dimension. The first dimension is represented by X, and the second dimension is represented by Y. The first pixel groups and the second pixel groups alternately adjacent to each other in the first direction are shifted from each other by [Y/n] in the second direction, where the n is a natural number of two or more. The first pixel groups and the third pixel groups alternately adjacent to each other in the second direction are shifted from each other by [X/n] in the first direction. The third pixel groups and the fourth pixel groups alternately adjacent to each other in the first direction are shifted from each other by [Y/n] in the second direction. The second pixel groups and the fourth pixel groups alternately adjacent to each other in the second direction are shifted from each other by [X/n] in the first direction. An imaging device according to an embodiment of the present disclosure includes a first pixel group including first photoelectric conversion regions, and at least one first color filter on the first photoelectric conversion regions. The imaging device includes a second pixel group including second photoelectric conversion regions, and at least one second color filter on the second photoelectric conversion regions. The imaging device includes a dummy region between the first pixel group and the second pixel group in a first direction so that a first side of the dummy region is adjacent to the first pixel group and a second side of the dummy region is adjacent to the second pixel group. The dummy region is a same size as one pixel in the first pixel group or the second pixel group. The dummy region does not have a color filter. The dummy region is an infrared detection region that detects infrared light, a phase difference detection region that detects a phase difference, or a distance detection region that detects distance. The second pixel group is offset from the first pixel group in a second direction perpendicular to the first direction. The second pixel group is offset from the first pixel group by a distance X/n, where X is a dimension of the first pixel group in the first direction and n is a natural number of at least two. The first pixel group includes a first 2×2 array of pixels, and the second pixel group includes a second 2×2 array of pixels. The imaging device includes a third pixel group adjacent to a third side of the dummy region. The third pixel group includes third photoelectric conversion regions, and at least one third color filter on the third photoelectric conversion regions. The imaging device includes a fourth pixel group adjacent to a fourth side of the dummy region. The fourth pixel group includes fourth photoelectric conversion regions, and at least one fourth color filter on the fourth photoelectric conversion regions. The first, second, third, and fourth pixel groups are arranged such that the dummy region is surrounded by the first, second, third, and fourth pixel groups. The at least one third color filter and the at least one fourth color filter pass a same range of wavelengths of light. The first side and the second side of the dummy region are opposite sides, and the third side and the fourth side of the dummy region are opposite sides. Each pixel in the first, second, third, and fourth pixel groups includes a memory and a floating diffusion coupled to the memory. The imaging device includes an isolation region between each pixel in the first and second pixel groups. The first photoelectric conversion regions and the second photoelectric conversion regions are disposed in a substrate, and the isolation region penetrates a first surface of the substrate and is surrounded by a portion of the substrate having a different conductivity type than the first and second photoelectric conversion regions. An imaging device according to an embodiment of the present disclosure includes a dummy pixel, a first pixel group, a second pixel group, a third pixel group, and a fourth pixel group, where the first, second, third, and fourth pixel groups surround the dummy pixel. Each of the first, second, third, and fourth pixel groups includes a 2×2 array of pixels. Each pixel group has a respective color filter that passes green, red, or blue light. The dummy pixel does not have a color filter. The imaging device includes a substrate including photoelectric conversion regions of each pixel, a memory disposed in the substrate, and a wiring layer on one side of the substrate and including at least one transistor coupled to the memory. An imaging device according to an embodiment of the present disclosure includes a plurality of pixel groups, and a plurality of dummy regions interspersed amongst the plurality of pixel groups such that each side of each dummy region is adjacent to one pixel in each pixel group.

BRIEF DESCRIPTION OF DRAWINGS

The accompanying drawings are included to provide a further understanding of the technology, and are incorporated in and constitute a part of this specification. The drawings show illustrative embodiments and, together with the specification, serve to explain various principles of the technology.

DESCRIPTION OF EMBODIMENTS

Some embodiments of the present disclosure are described in detail below with reference to the drawings. It is to be noted that description is given in the following order.
1. Embodiment
An example of an imaging element in which relative positions of a plurality of pixel groups arranged in a "Quadra" arrangement are shifted by a predetermined amount in a vertical direction and a horizontal direction
2. Modification Examples of Embodiment
(2.1) First Modification Example: an example in which a white pixel is provided in a gap region surrounded by the plurality of pixel groups
(2.2) Second Modification Example: an example in which a near-infrared light detection pixel is provided in the gap region surrounded by the plurality of pixel groups
(2.3) Third Modification Example: an example in which an image plane phase detection pixel is provided in the gap region of the plurality of pixel groups
(2.4) Fourth Modification Example: an example in which a distance-measuring pixel is provided in the gap region of the plurality of pixel groups
3. Application Example to Electronic Apparatus
4. Further Application Example to Mobile Body
5. Other Modification Examples

1. Embodiment

Configuration of Solid-State Imaging Element 101

Figure 1:
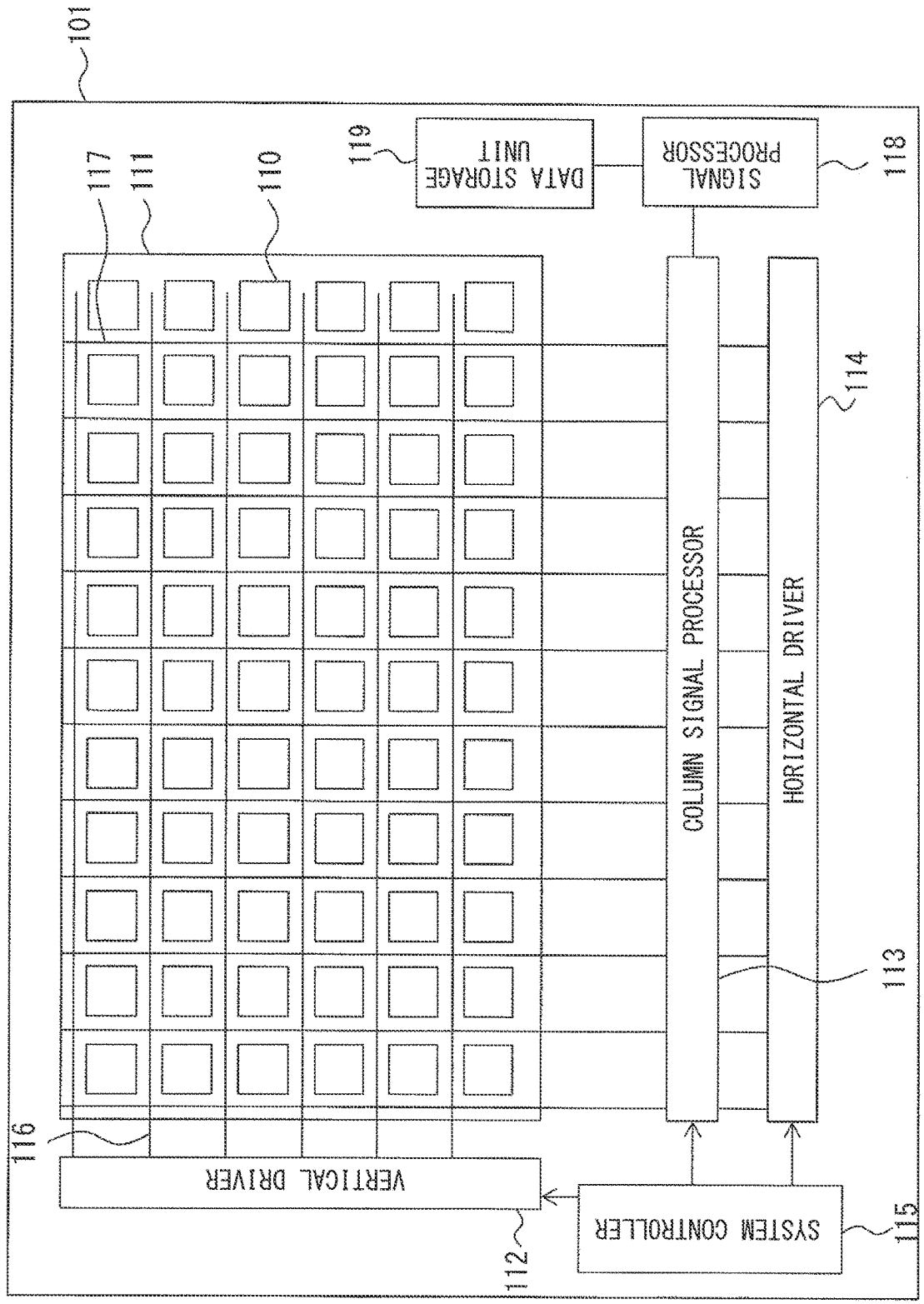
FIG. 1 is a block diagram illustrating an entire configuration example of a function of an imaging element according to an embodiment of the present disclosure.

FIG. 1 is a block diagram illustrating a configuration example of a function of a solid-state imaging element (or imaging device) 101 according to an embodiment of the present disclosure.

The solid-state imaging element 101 includes, for example, a so-called global shutter system back-illuminated image sensor a such as a complementary metal oxide semiconductor (CMOS) image sensor. The solid-state imaging element 101 receives light from an object, and performs photoelectric conversion on the light to generate an image signal, thereby capturing an image.

The global shutter system indicates a system in which global exposure is performed. In the global exposure, basically, exposure of all pixels simultaneously starts and simultaneously ends. Herein, all pixels indicates all pixels in a portion appearing in an image, and exclude a dummy pixel and any other pixel. Moreover, in a case where a time difference and image distortion is small enough not to cause an issue, the global shutter system encompasses a system in which while global exposure of pixels is performed in units of two or more rows, for example, in units of several tens of rows instead of simultaneously performing exposure of all pixels, a region where the global exposure is performed moves. Further, the global shutter system also encompasses a system in which global exposure of pixels in a predetermined region is performed, instead of exposure of all pixels in a portion appearing in an image.

The back-illuminated image sensor indicates an image sensor having a configuration in which a photoelectric converter such as a photodiode is provided between a light reception surface and a wiring layer. The photodiode receives light from an object and converts the light into an electrical signal. The light from the object enters the light reception surface. The wiring layer includes wiring such as a transistor that drives each pixel.

The solid-state imaging element 101 includes, for example, a pixel array unit 111, a vertical driver 112, a column signal processor 113, a data storage unit 119, a horizontal driver 114, a system controller 115, and a signal processor 118.

In the solid-state imaging element 101, the pixel array unit 111 is provided on a semiconductor substrate 11 to be described later. Peripheral circuits such as the vertical driver 112, the column signal processor 113, the data storage unit 119, the horizontal driver 114, the system controller 115, and the signal processor 118 are provided, for example, on the semiconductor substrate 11 where the pixel array unit 111 is provided.

The pixel array unit 111 includes a plurality of sensor pixels 110 each including a photoelectric converter (PD) 51 to be described later. The PD 51 generates a charge corresponding to an amount of light incident from an object, and accumulates the charge. The sensor pixels 110 are arranged along a horizontal direction, i.e., a row direction and a vertical direction, i.e., a column direction, as illustrated in FIG. 1. In the pixel array unit 111, pixel drive lines 116 are wired along the row direction with respective pixel rows each including the sensor pixels 110 arranged in one line in the row direction, and vertical signal lines (VSLs) 117 are wired along the column direction with respective pixel columns each including the sensor pixels 110 arranged in one line in the column direction.

The vertical driver 112 includes a shift register, an address decoder, and any other component. The vertical driver 112 supplies, for example, a signal to the plurality of sensor pixels 110 through a plurality of pixel drive lines 116 to drive all the plurality of sensor pixels 110 in the pixel array unit 111 simultaneously or on a pixel row-by-pixel row basis.

The vertical driver 112 inputs a drive signal S58 to a discharging transistor (OFG) 58 to be described later to turn on the OFG 58, thereby causing conduction between the PD 51 to be described later in each of the sensor pixels 110 and a power source VDD2. As a result, an unnecessary charge is discharged from the PD 51. Such an operation is referred to as "reset". Thereafter, the vertical driver 112 inputs the drive signal S58 to the OFG 58 to turn off the OFG 58, which makes it possible to start exposure of each of the sensor pixels 110. After the start of the exposure, the vertical driver 112 inputs the drive signal S58 to a first transfer transistor (TG) 52A to turn the TG 52A from on to off, which makes it possible to transfer a charge generated and accumulated in the PD 51 to a charge holding unit (MEM) 59 to be described later. The exposure ends upon completion of transfer of the charge from the PD 51 to the MEM 59.

Herein, an OFF operation of the OFG 58 and an OFF operation of the TG 52A are performed simultaneously on all the sensor pixels 110 in the pixel array unit 111. Hence, exposure of all the sensor pixels 110 in the pixel array unit 111 starts simultaneously, and ends simultaneously.

Signals outputted from respective unit pixels in a pixel row selected and scanned by the vertical driver 112 are supplied to the column signal processor 113 through the respective VSLs 117. The column signal processor 113 performs predetermined signal processing on the signals outputted from the respective unit pixels in the selected row through the VSLs 117 on a pixel column-by-pixel column basis, and temporarily holds pixel signals having been subjected to the signal processing.

Specifically, the column signal processor 113 includes, for example, a shift register, an address decoder, and any other component, and performs processing such as noise removal, correlated double sampling, and analog-to-digital (A/D) conversion of an analog pixel signal to generate a digital pixel signal. The column signal processor 113 supplies the thus-generated pixel signal to the signal processor 118.

The horizontal driver 114 includes a shift register, an address decoder, and any other component, and sequentially selects unit circuits corresponding to pixel columns of the column signal processor 113. The pixel signals having been subjected to the signal processing in the respective unit circuits in the column signal processor 113 are sequentially outputted to the signal processor 118 by selection and scanning by the horizontal driver 114.

The system controller 115 includes a timing generator and any other component. The timing generator generates various kinds of timing signals. The system controller 115 performs driving control of the vertical driver 112, the column signal processor 113, and the horizontal driver 114 on the basis of the timing signals generated by the timing generator.

The signal processor 118 performs signal processing such as operational processing on the pixel signals supplied from the column signal processor 113 to output an image signal including the respective pixel signals, while temporarily storing data in the data storage unit 119 as necessary.

In the signal processing by the signal processor 118, the data storage unit 119 temporarily holds data necessary for the signal processing.

Configuration of Sensor Pixel 110

Circuit Configuration Example

Figure 2:
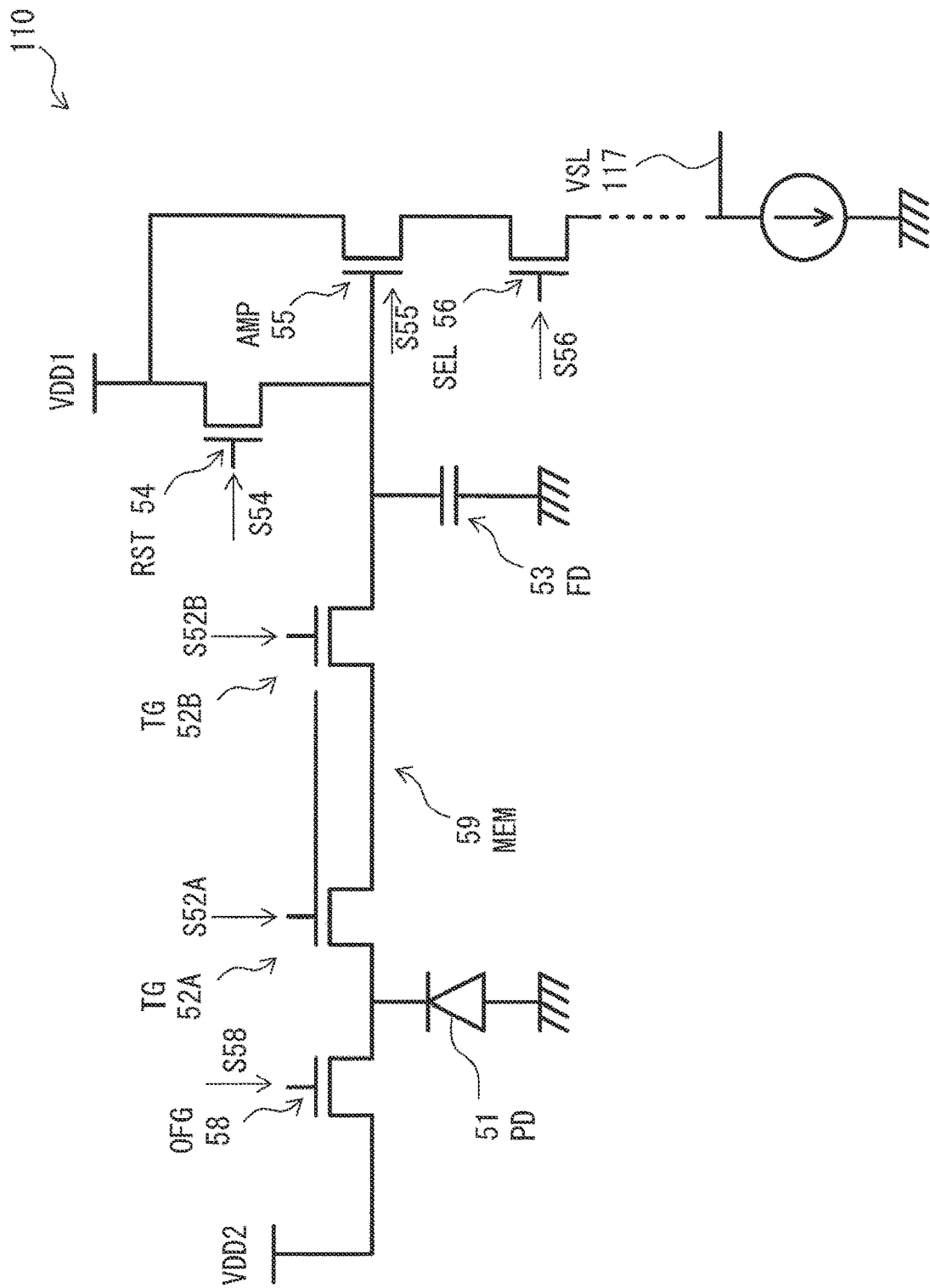
FIG. 2 is a circuit diagram illustrating a circuit configuration of one pixel group in the imaging element illustrated in FIG. 1.

Next, description is given of a circuit configuration example of the sensor pixel 110 provided in the pixel array unit 111 in FIG. 1 with reference to FIG. 2. FIG. 2 illustrates a circuit configuration example of one sensor pixel 110 of the plurality of sensor pixels 110 included in the pixel array unit 111.

In the example illustrated in FIG. 2, the sensor pixel 110 in the pixel array unit 111 implements a memory-holding type global shutter. The sensor pixel 110 includes power sources VDD1 and VDD2, the PD 51, the TG 52A, a second transfer transistor (TG) 52B, a charge-to-voltage converter (FD) 53, a reset transistor (RST) 54, an amplification transistor (AMP) 55, a select transistor (SEL) 56, the OFG 58, and the MEM 59.

In this example, each of the TGs 52A and 52B, the RST 54, the AMP 55, the SEL 56, and the OFG 58 includes an N-type MOS transistor. Drive signals S52A, S52B, S54, S56, and S58 are respectively supplied to gate electrodes of TGs 52A and 52B, the RST 54, SEL 56, and the OFG 58 by the vertical driver 112 and the horizontal driver 114 on the basis of driving control by the system controller 115. Moreover, a drive signal S55 is supplied from the FD 53 in the sensor pixel 110 to the gate electrode of the AMP 55. Each of the drive signals S52A, S52B, S54, S55, S56, and S58 serves as a pulse signal in which a high level state indicates an active state (an ON state) and a low level state indicates an inactive state (an OFF state). It is to be noted that hereinafter, turning the drive signal to the active state is also referred to "turning on the drive signal", and turning the drive signal to the inactive state is also referred to as "turning off the drive signal".

The PD 51 includes, for example, a photoelectric conversion element including a PN-junction photodiode. The PD 51 receives light from an object and generates a charge corresponding to an amount of the received light by photoelectric conversion and accumulates the charge.

The MEM 59 is disposed between the PD 51 and the FD 53. In order to achieve a global shutter function, the MEM 59 serves as a region where the charge generated and accumulated in the PD 51 is temporarily stored until the charge is transferred to the FD 53.

The TG 52A is disposed between the PD 51 and the MEM 59, and the TG 52B is disposed between the MEM 59 and the FD 53. The TG 52A transfers the charge accumulated in the PD 51 to the MEM 59 in accordance with the drive signal S52A applied to the gate electrode of the TG 52A. The TG 52B transfers the charge temporarily stored in the MEM 59 to the FD 53 in accordance with the drive signal S52B applied to the gate electrode of the TG 52B. In the sensor pixel 110, for example, the drive signal S52A is turned off to turn off the TG 52A and the drive signal S52B is turned on to turn on the TG 52B, which causes the charge stored in the MEM 59 to be transferred to the FD 53 through the TG 52B.

The RST 54 includes a drain coupled to the power source VDD1 and a source coupled to the FD 53. The RST 54 initializes, that is, resets the FD 53 in accordance with the drive signal S54 applied to the gate electrode of the RST 54. For example, the drive signal S54 is turned on to turn on the RST 54, which causes a potential of the FD 53 to be reset to a voltage level of the power source VDD1. In other words, initialization of the FD 53 is performed.

The FD 53 serves as a floating diffusion region that converts the charge transferred from the PD 51 through the TG 52A, the MEM 59, and the TG 52B into an electrical signal, for example, a voltage signal, and outputs the electrical signal. The FD 53 is coupled to the RST 54, and is coupled to the VSL 117 through the AMP 55 and the SEL 56.

The AMP 55 outputs the electrical signal corresponding to the potential of the FD 53. The AMP 55 configures a source-follower circuit with a constant current source provided in the column signal processor 113, for example. In a case where the sensor pixel 110 is selected, the SEL 56 is turned on, and outputs the electrical signal transferred from the FD 53 through the AMP 55 to the column signal processor 113 through the VSL 117.

The sensor pixel 110 further includes, in addition to the FD 53, the power source VDD2 as a transfer destination of the charge of the PD 51. The OFG 58 is disposed between the PD 51 and the power source VDD2.

The OFG 58 includes a drain coupled to the power source VDD2 and a source coupled to wiring that couples the TG 52A and the PD 51 to each other. The OFG 58 initializes, that is, resets the PD 51 in accordance with the drive signal S58 applied to the gate electrode of the OFG 58. Resetting PD 51 means depleting the PD 51.

Moreover, the OFG 58 forms an overflow path between the TG 52A and the power source VDD2 to discharge a charge overflowed from the PD 51 to the power source VDD2. Thus, in the sensor pixel 110 according to the present embodiment, it is possible for the OFG 58 to directly reset the PD 51.

(Planar Configuration Example of Pixel Array Unit 111)

Figure 3:
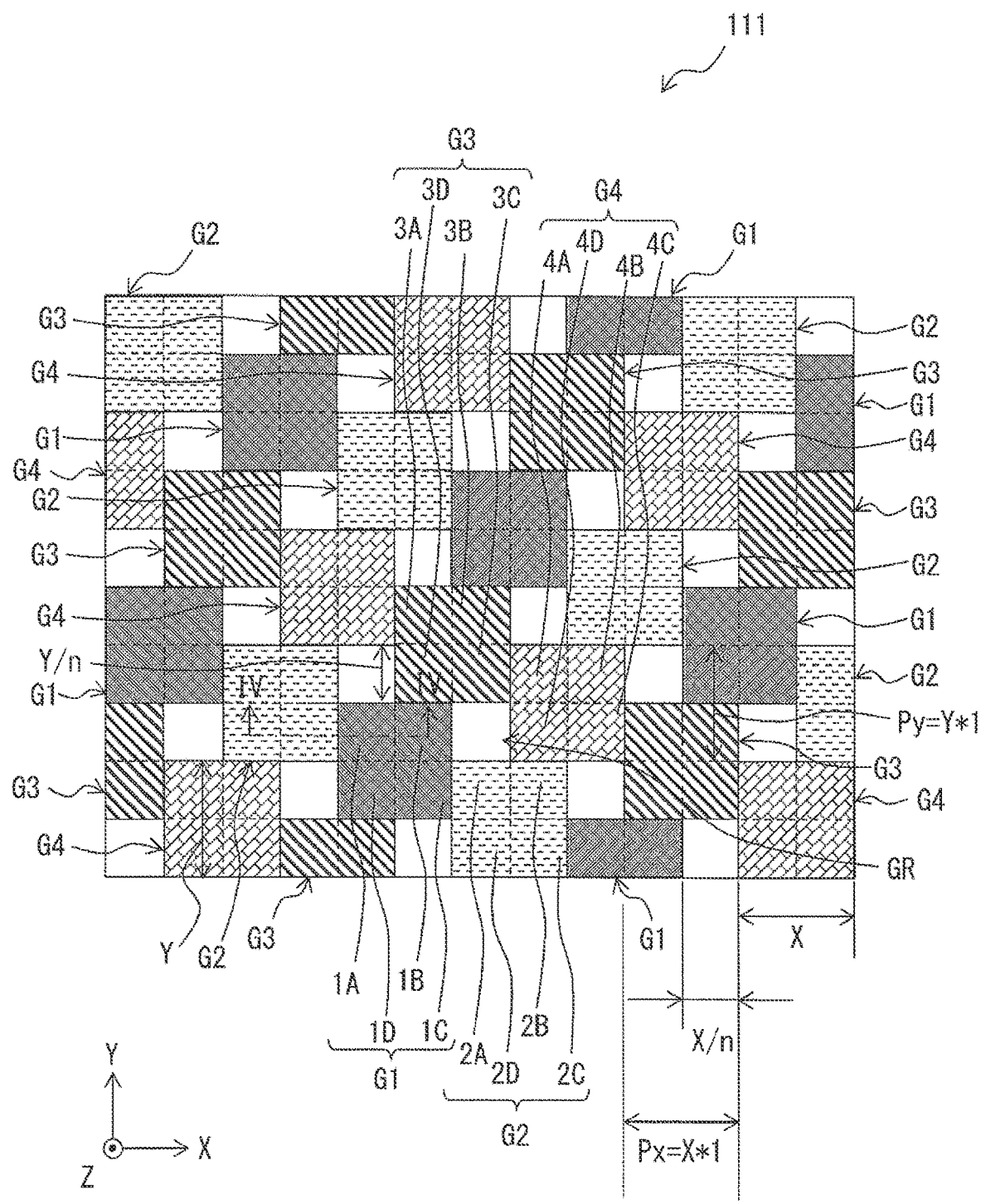
FIG. 3 is a plan view of a planar configuration example of a pixel array unit in the imaging element illustrated in FIG. 1.

Next, description is given of a planar configuration example and a cross-sectional configuration example of the pixel array unit 111 in FIG. 1 with reference to FIG. 3. FIG. 3 is a schematic plan view of a planar configuration example of a portion of the pixel array unit 111.

As illustrated in FIG. 3, the pixel array unit 111 of the solid-state imaging element 101 includes, for example, a plurality of pixel groups of four kinds, i.e., a plurality of first pixel groups G1, a plurality of second pixel groups G2, a plurality of third pixel groups G3, and a plurality of fourth pixel groups G4. Each of the plurality of first pixel groups G1 includes a plurality of first pixels 1 arranged in a two-dimensional array of m first pixels in an X-axis direction (or X direction) and the m first pixels 1 in a Y-axis direction (or Y-direction), where m is a natural number of two or more. Each of the first pixels 1 corresponds to the sensor pixel 110 described in FIGS. 1 and 2. It is to be noted that FIG. 3 and other diagrams illustrate a case of m=2 as an example, and description is given of the case of m=2 in the present embodiment. Accordingly, each of the plurality of first pixel groups G1 includes four first pixels 1A to 1D arranged in a two row-by-two column square arrangement. Likewise, each of the plurality of second pixel groups G2 includes a plurality of second pixels 2 arranged in a two-dimensional array of m second pixels 2 in the X-axis direction and m second pixels 2 in the Y-axis direction, and includes, for example, four second pixels 2A to 2D arranged in a two row-by-two column square arrangement, as illustrated in FIG. 3. Each of the second pixels 2 corresponds to the sensor pixel 110 described in FIGS. 1 and 2. Likewise, each of the plurality of third pixel groups G3 includes a plurality of third pixels 3 arranged in a two-dimensional array of m third pixels 3 in the X-axis direction and m third pixels 3 in the Y-axis direction, and includes, for example, four third pixels 3A to 3D arranged in a two row-by-two column square arrangement, as illustrated in FIG. 3. Each of the third pixels 3 corresponds to the sensor pixel 110 described in FIGS. 1 and 2. Likewise, each of the plurality of fourth pixel groups G4 includes a plurality of fourth pixels 4 arranged in a two-dimensional array of m fourth pixels 4 in the X-axis direction and m fourth pixels in the Y-axis direction, and includes, for example, four fourth pixels 4A to 4D arranged in a two row-by-two column square arrangement, as illustrated in FIG. 3. Each of the fourth pixels 4 corresponds to the sensor pixel 110 described in FIGS. 1 and 2.

In the pixel array unit 111, dimensions X in the X-axis direction of the first pixel groups G1, the second pixel groups G2, the third pixel groups G3, and the fourth pixel groups G4 are all substantially equal to a first dimension X, and dimensions in the Y-axis direction of the first pixel groups G1, the second pixel groups G2, the third pixel groups G3, and the fourth pixel groups G4 are all substantially equal to a second dimension. Herein, specifically, the first dimension X and the second dimension Y are preferably substantially equal to each other, that is, X=Y is preferable. It is to be noted that the X-axis direction corresponds to a specific but non-limiting example of a "first direction" in an embodiment of the present disclosure, and the Y-axis direction corresponds to a specific but non-limiting example of a "second direction" in an embodiment of the present disclosure.

In the pixel array unit 111, the first to fourth pixel groups G1 to G4 are arranged in a "Quadra" arrangement. In other words, in the X-axis direction, the first pixel groups G1 and the second pixel groups G2 are alternately arranged, and the third pixel groups G3 and the fourth pixel groups G4 are alternately arranged. Note that the first pixel groups G1 and the second pixel groups G2 alternately adjacent to each other in the X-axis direction are shifted from each other by [Y/n] in the Y-axis direction, where n is a natural number of two or more. Likewise, the third pixel groups G3 and the fourth pixel groups G4 alternately adjacent to each other in the X-axis direction are shifted from each other by [Y/n] in the Y-axis direction. It is to be noted that FIG. 3 illustrates a case of n=2 as an example. Accordingly, in the example in FIG. 3, the first pixel groups G1 and the second pixel groups G2 are arranged alternately adjacent to each other to be displaced from each other by [Y/2] in a −Y direction along a +X direction. Moreover, the third pixel groups G3 and the fourth pixel groups G4 are arranged alternately adjacent to each other to be displaced from each other in the −Y direction by [Y/2] toward the +X direction.

In the pixel array unit 111, as illustrated in FIG. 3, in the Y-axis direction, the first pixel groups G1 and the third pixel groups G3 are alternately arranged, and the second pixel groups G2 and the fourth pixel groups G4 are alternately arranged. Note that the first pixel groups G1 and the third pixel groups G3 alternately adjacent to each other in the Y-axis direction are shifted from each other by [X/n] in the X-axis direction, where n is a natural number of two or more. Likewise, the second pixel groups G2 and the fourth pixel groups G4 alternately adjacent to each other in the Y-axis direction are shifted from each other by [X/n] in the X-axis direction. It is to be noted that FIG. 3 illustrates a case of n=2 as an example. Accordingly, in the example in FIG. 3, the first pixel groups G1 and the third pixel groups G3 are arranged alternately adjacent to each other to be displaced from each other by [X/2] in the +X direction toward a +Y direction. Moreover, the second pixel groups G2 and the fourth pixel groups G4 are arranged alternately adjacent to each other to be displaced from each other by [X/2] in the +X direction toward the +Y direction.

Figure 15:
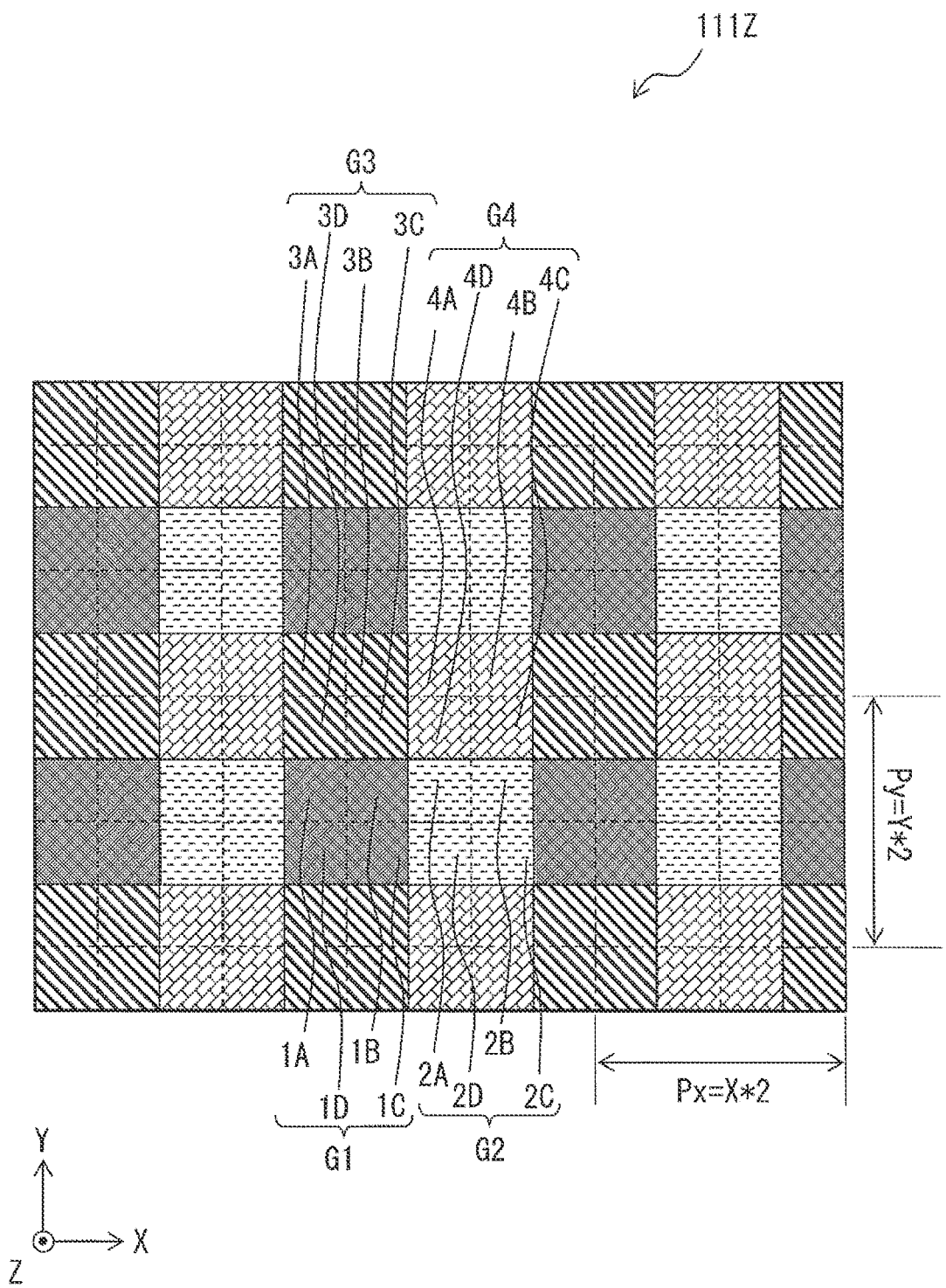
FIG. 15 is a plan view of a planar configuration example of a pixel array unit as a reference example.

Herein, the pixel array unit 111 according to the present embodiment is compared with, for example, a pixel array unit 111Z as a reference example illustrated in FIG. 15. In the pixel array unit 111Z as the reference example illustrated in FIG. 15, the first to fourth pixel groups G1 to G4 are straightly arranged along the X-axis direction and the Y-axis direction without being shifted. As compared with the pixel array unit 111Z as the reference example illustrated in FIG. 15, in the pixel array unit 111, for example, in a case where attention is focused on a certain pixel group (for example, the first pixel group G1), other pixel groups (for example, two second pixel groups G2 and two third pixel groups G3) are moved by X/n or Y/n toward a clockwise direction with the certain pixel group as a center. Accordingly, in the pixel array unit 111, one gap region (or dummy region, or dummy pixel) GR surrounded by the first pixel group G1, the second pixel group G2, the third pixel group G3, and the fourth pixel group G4 is present for every four pixel groups. The gap region (or dummy region, or dummy pixel) GR may be a region of the pixel array unit 111 that is not used to sense color (e.g., R, G, or B), and thus, may not include a color filter and is not part of the Quadra arrangement that includes pixel groups G1 to G4. The gap region (or dummy region, or dummy pixel) GR may have a same size as one pixel in the groups G1 to G4 or may have a different size, according to design preferences. In at least one example embodiment, the gap region (or dummy region, or dummy pixel) GR is an infrared detection region that detects infrared light, a phase difference detection region that detects a phase difference, or a distance detection region that detects distance. Thus, the gap region (or dummy region, or dummy pixel) GR may have no color filter or a color filter other than an R, G, or B color filter such as, a gray color filter or a clear color filter. As shown, the pixel group G1 is offset from the pixel group G4 in the X direction, the pixel group G2 is offset from the pixel group G3 in the Y direction. Thus, the first, second, third, and fourth pixel groups G1 to G4 are arranged such that the gap region (or dummy region, or dummy pixel) GR is surrounded by the first, second, third, and fourth pixel groups G1 to G4 in a plan view. Said another way, a plurality of gap regions (or dummy regions, or dummy pixels) GR are interspersed amongst the plurality of pixel groups G1s, G2s, G3s, and G4s such that each side of each gap region (or dummy region, or dummy pixel) GR is adjacent to one pixel in each pixel group G1 to G4.

Moreover, in the pixel array unit 111, both the first pixels 1 and the fourth pixels 4 detect green light (G) as a first color, the second pixels 2 detect red light (R) as a second color, and the third pixels 3 detect blue light (B) as a third color. Accordingly, colors of the first to fourth pixel groups G1 to G4 are arranged in a Bayer arrangement.

(Cross-Sectional Configuration Example of Pixel Array Unit 111)

Figure 4:
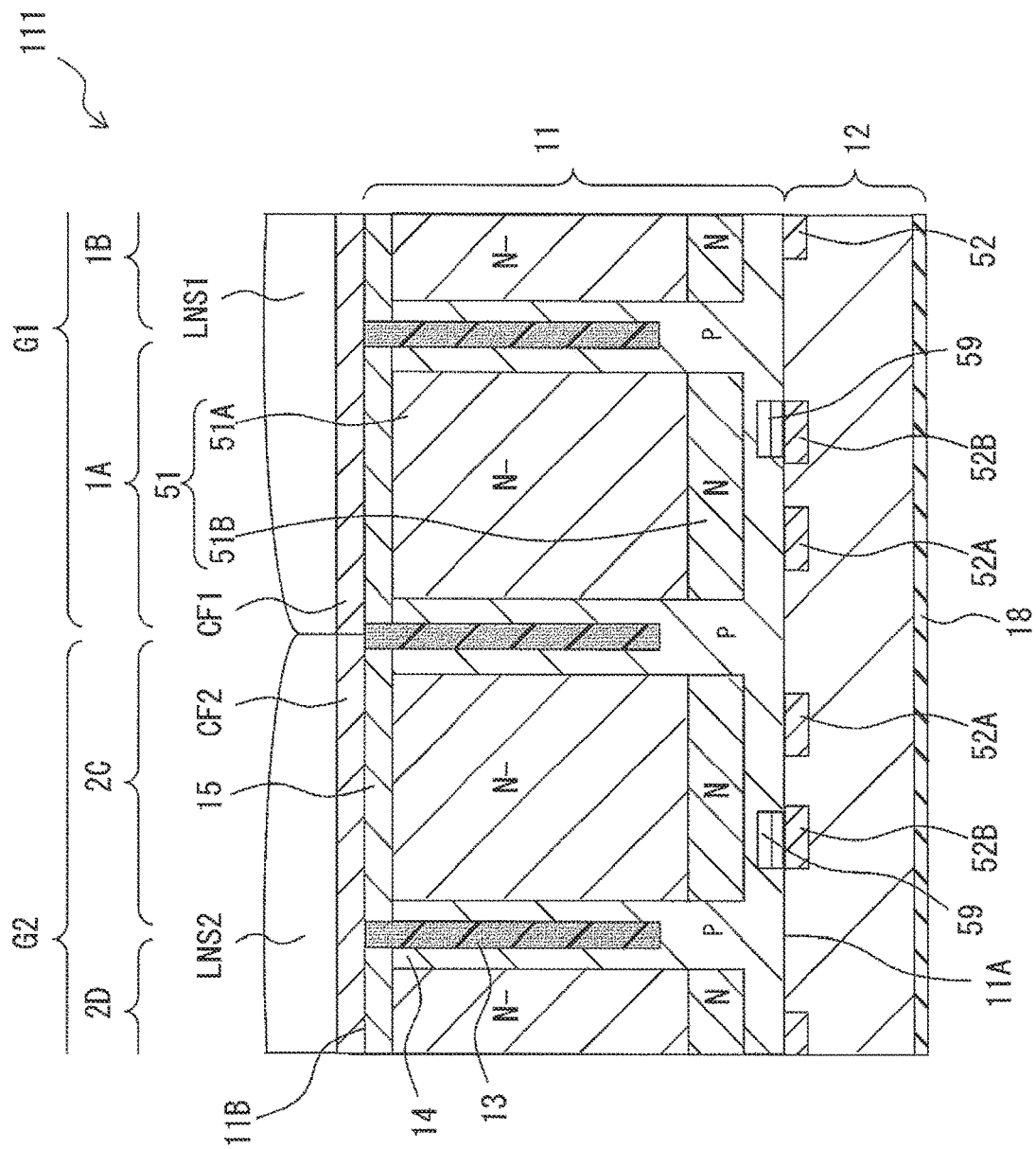
FIG. 4 is a cross-sectional view of a cross-sectional configuration of one pixel group in the imaging element illustrated in FIG. 1.

Next, description is given of a cross-sectional configuration example of the pixel array unit 111 in FIG. 1 with reference to FIG. 4. FIG. 4 is a cross-sectional view of a configuration example of a cross section passing through the first pixel group G1 and the second pixel group G2 adjacent to each other in the X-axis direction. The cross section in FIG. 4 corresponds to a cross section taken in a direction of an arrow along a line IV-IV in FIG. 3. It is to be noted that the first to fourth pixel groups G1 to G4 have substantially a same configuration, except that the colors of the color filters CF in the first to fourth pixel groups G1 to G4 are different.

As illustrated in FIG. 4, each of the sensor pixels 110, that is, each of the first pixels provided in the first pixel group G1 and the second pixels 2 provided in the second pixel group G2 includes the semiconductor substrate 11, a wiring layer 12, the color filter CF (CF1 or CF2), and an on-chip lens LNS (LNS1 or LNS2).

The semiconductor substrate 11 includes, for example, a monocrystal silicon substrate. The semiconductor substrate 11 has a back surface 11B and a front surface 11A on a side opposite to the back surface 11B. The back surface 11B serves as a light reception surface that receives light from an object having passed through the on-chip lens LNS and the color filter CF.

The PD 51 is provided in the semiconductor substrate 11. The PD 51 has an N-type semiconductor region 51A and an N-type semiconductor region 51B in order from a position close to the back surface 11B, for example. Light having entered the back surface 11B is subjected to photoelectric conversion in the N-type semiconductor region 51A to generate a charge, and thereafter, the charge is accumulated in the N-type semiconductor region 51B. It is to be noted that a boundary between the N-type semiconductor region 51A and the N-type semiconductor region 51B is not necessarily clear, and, for example, it is sufficient if the concentration of an N-type impurity is gradually increased from the N-type semiconductor region 51A to the N-type semiconductor region 51B.

The element separator (or isolation region) 13 is further provided in the semiconductor substrate 11. The element separator 13 includes a wall-shaped member that extends in a Z-axis (or Z direction) direction to penetrate through the semiconductor substrate 11 at a boundary position between adjacent ones of the sensor pixels 110, and surrounds each of the PDs 51. The adjacent ones of the sensor pixels 110 are electrically separated from each other by the element separator 13. The element separator 13 includes, for example, an insulation material such as silicon oxide. The semiconductor substrate 11 may further have a P-type semiconductor region 14 between the element separator 13 and each of the PDs 51. The P-type semiconductor region 14 is provided along a side surface of the element separator 13.

A fixed charge film 15 is provided to cover the back surface 11B, and has a negative fixed charge to suppress generation of a dark current caused by an interface state of the back surface 11B serving as the light reception surface of the semiconductor substrate 11. A hole accumulation layer is provided near the back surface 11B of the semiconductor substrate 11 by an electric field induced by the fixed charge film 15. The hole accumulation layer suppresses generation of electrons from the back surface 11B.

The color filter CF is provided on the fixed charge film 15. Any other film such as an antireflection film and a planarization film may be interposed between the color filter CF and the fixed charge film 15. It is to be noted that in the first pixel group G1, for example, one color filter CF1 is provided for four first pixels 1 (1A to 1D). Likewise, in the second pixel group G2, one color filter CF2 is provided for four second pixels 2 (2A to 2D). In the third pixel group G3, one color filter CF3 is provided for four third pixels 3 (3A to 3D). In the fourth pixel group G4, one color filter CF4 is provided for four fourth pixels 4 (4A to 4D). In the present embodiment, the colors of the color filter CF1 and the color filter CF4 are green, the color of the color filter CF2 is red, and the color of the color filter CF3 is blue.

The on-chip lens LNS is located on a side opposite to the fixed charge film 15 as viewed from the color filter CF, and is provided in contact with the color filter CF. In the first pixel group G1, one on-chip lens LNS1 is provided for four first pixels 1 (1A to 1D) to cover all the light reception surfaces of the four first pixels 1. Likewise, in the second pixel group G2, one on-chip lens LNS2 is provided for four second pixels 2 (2A to 2D) to cover all the light reception surfaces of the four second pixels 2. In the third pixel group G3, one on-chip lens LNS3 is provided for four third pixels 3 (3A to 3D) to cover all the light reception surfaces of the four third pixels 3. In the fourth pixel group G4, one on-chip lens LNS4 is provided for four fourth pixels 4 (4A to 4D) to cover all the light reception surfaces of the four fourth pixels 4.

The wiring layer 12 is provided to cover the front surface 11A of the semiconductor substrate 11, and includes the TG 52A, the TG 52B, the MEM 59, and any other component included in a pixel circuit of the sensor pixel 110 illustrated in FIG. 2. A surface, on a side opposite to the front surface 11A, of the wiring layer 12 is covered with an insulation layer 18.

Workings and Effects of Solid-State Imaging Element 101

As described above, in the solid-state imaging element 101 according to the present embodiment, relative positions of pixels groups of two kinds (for example, the first pixel groups G1 and the second pixel groups G2) alternately arranged in the X-axis direction are shifted from each other by a predetermined amount (Y/n) in the Y-axis direction. Moreover, relative positions of pixels groups of two kinds (for example, the first pixel groups G1 and the third pixel groups G3) alternately arranged in the Y-axis direction are shifted from each other by a predetermined amount (X/n) in the X-axis direction. This makes it possible to shorten an arrangement pitch in the X-axis direction and an arrangement pitch in the Y-axis direction of the pixel groups in the pixel array unit 111.

Herein, the pixel array unit 111 according to the present embodiment is compared with the pixel array unit 111Z as the reference example illustrated in FIG. 15, for example. In the pixel array unit 111Z, along the X-axis direction, the first pixel groups G1 and the second pixel groups G2 are alternately arranged, and the third pixel groups G3 and the fourth pixel groups G4 are alternately arranged. Moreover, in the pixel array unit 111Z, along the Y-axis direction, the first pixel groups G1 and the third pixel groups G3 are alternately arranged, and the second pixel groups G2 and the fourth pixel groups G4 are alternately arranged. On this occasion, in the pixel array unit 111Z, an interval Px between two first pixel groups located closest to each other in the X-axis direction is represented by Px=X*2. In other words, in the pixel array unit 111Z, in a case where four first pixels 1 included in the first pixel group G1 are added to output an image, an output pitch Px of the first pixel group G1 in the X-axis direction is represented by Px=X*2. Moreover, in the pixel array unit 111Z, an interval Py between two first pixel groups G1 located closest to each other in the Y-axis direction is represented by Py=Y*2. In other words, in the pixel array unit 111Z, in the case where four first pixels 1 included in the first pixel group G1 are added to output an image, an output pitch Py of the first pixel group G1 in the Y-axis direction is represented by Py=Y*2. It is to be noted that in the pixel array unit 111Z illustrated in FIG. 15, a difference in output among pixels in one pixel group is caused by, for example, a displacement in an XY plane between the on-chip lens LNS and the PD 51 and color mixture resulting from light obliquely entering the on-chip lens LNS. Hence, in some cases, it is difficult to achieve higher resolution while maintaining image quality.

In contrast, in the pixel array unit 111 according to the present embodiment, as illustrated in FIG. 3, for example, the interval Px between two first pixel groups G1 located closest to each other in the X-axis direction is represented by Px=X*1. In other words, in the pixel array unit 111, in a case where four first pixels 1 included in the first pixel group G1 are added to output an image, the output pitch Px of the first pixel group G1 in the X-axis direction is represented by Px=X*1, which is equal to the dimension X in the X-axis direction of one first pixel group G1. Moreover, in the pixel array unit 111, the interval Py between two first pixel groups G1 located closest to each other in the Y-axis direction is represented by Py=Y*1. In other words, in the case where four first pixels 1 included in the first pixel group G1 are added to output an image, the output pitch Py of the first pixel group G1 in the Y-axis direction is represented by Py=Y*1, which is equal to the dimension Y in the Y-axis direction of one first pixel group G1. Accordingly, in the pixel array unit 111 according to the present embodiment, it is possible to double resolution in the X-axis direction and resolution in the Y-axis direction, as compared with the pixel array unit 111Z as the reference example.

2. Modification Examples of Embodiment (2.1)

Figure 5:
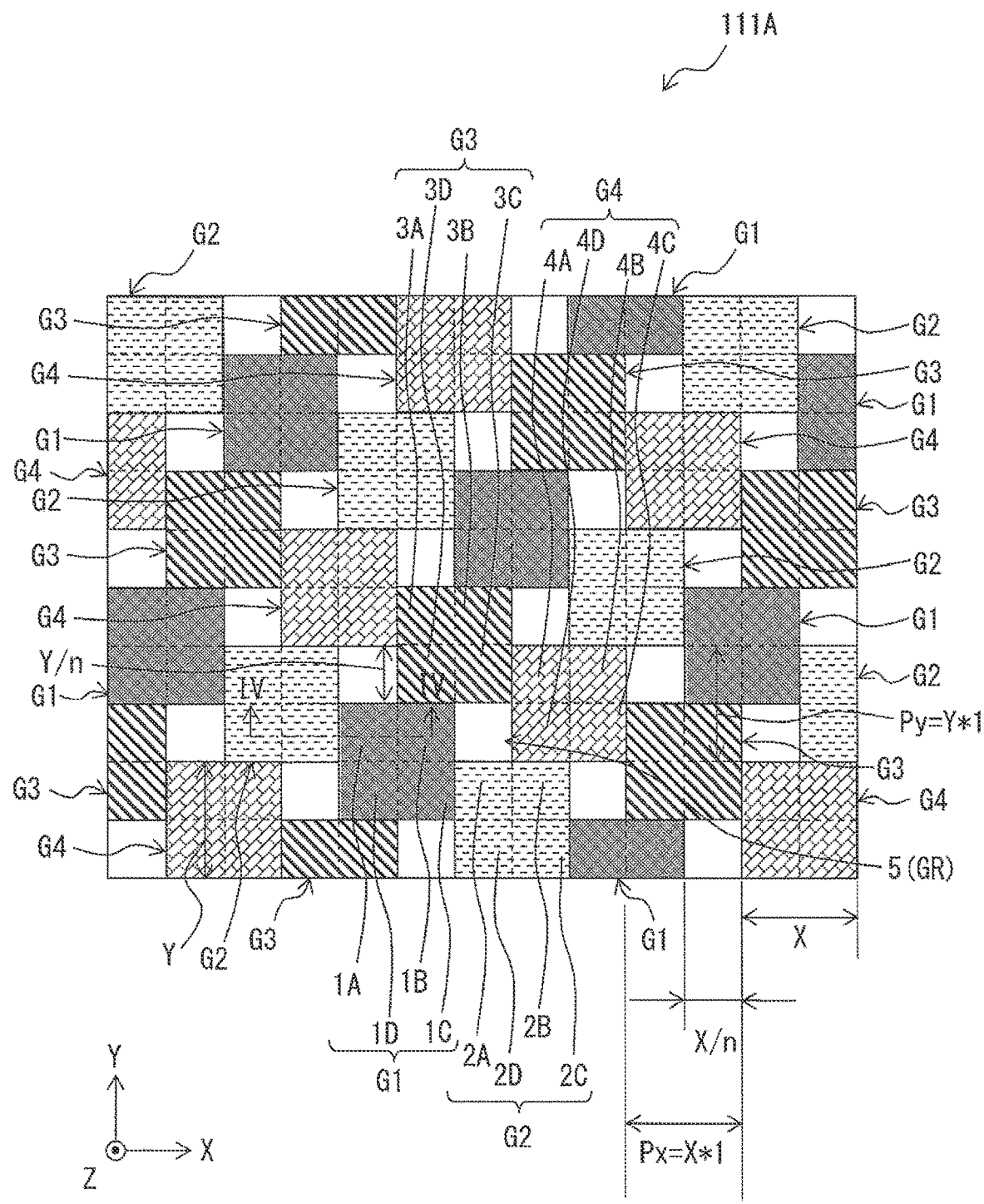
FIG. 5 is a plan view of a planar configuration example of a pixel array unit according to a first modification example of the present disclosure.

FIG. 5 is a schematic plan view of an entire configuration example of a pixel array unit 111A according to a first modification example of the embodiment of the present disclosure. In the pixel array unit 111A, a white pixel 5 is provided in the gap region GR. In a solid-state imaging element that includes the pixel array unit 111A having such a configuration, it is possible to achieve higher sensitivity while achieving higher resolution.

(2.2)

Figure 6:
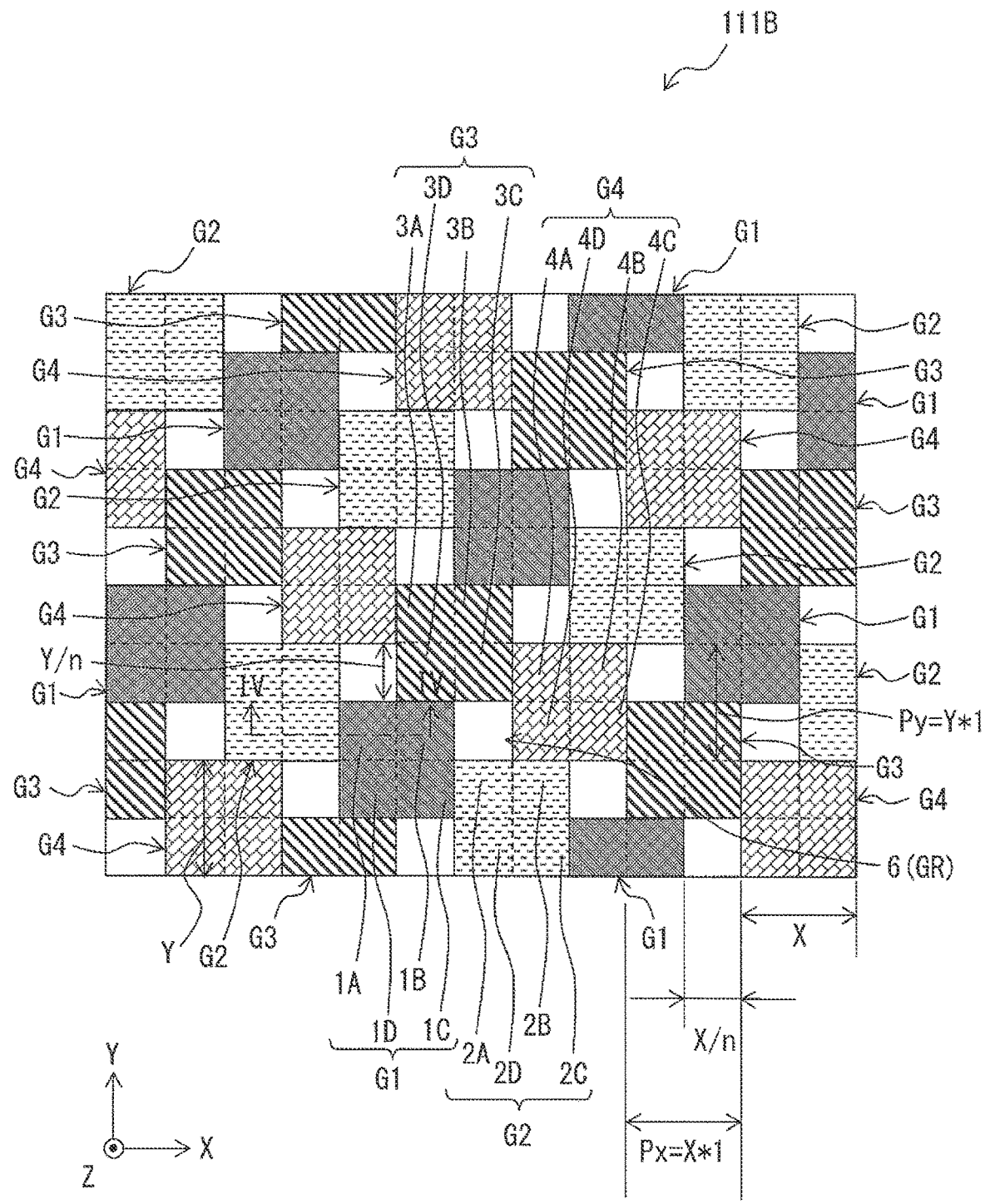
FIG. 6 is a plan view of a planar configuration example of a pixel array unit according to a second modification example of the present disclosure.

FIG. 6 is a schematic plan view of an entire configuration example of a pixel array unit 111B according to a second modification example of the embodiment of the present disclosure. In the pixel array unit 111B, a near-infrared light detection pixel 6 is provided in the gap region GR. In a solid-state imaging element that includes the pixel array unit 111B having such a configuration, it is possible to detect near-infrared light while achieving higher resolution.

(2.3)

Figure 7:
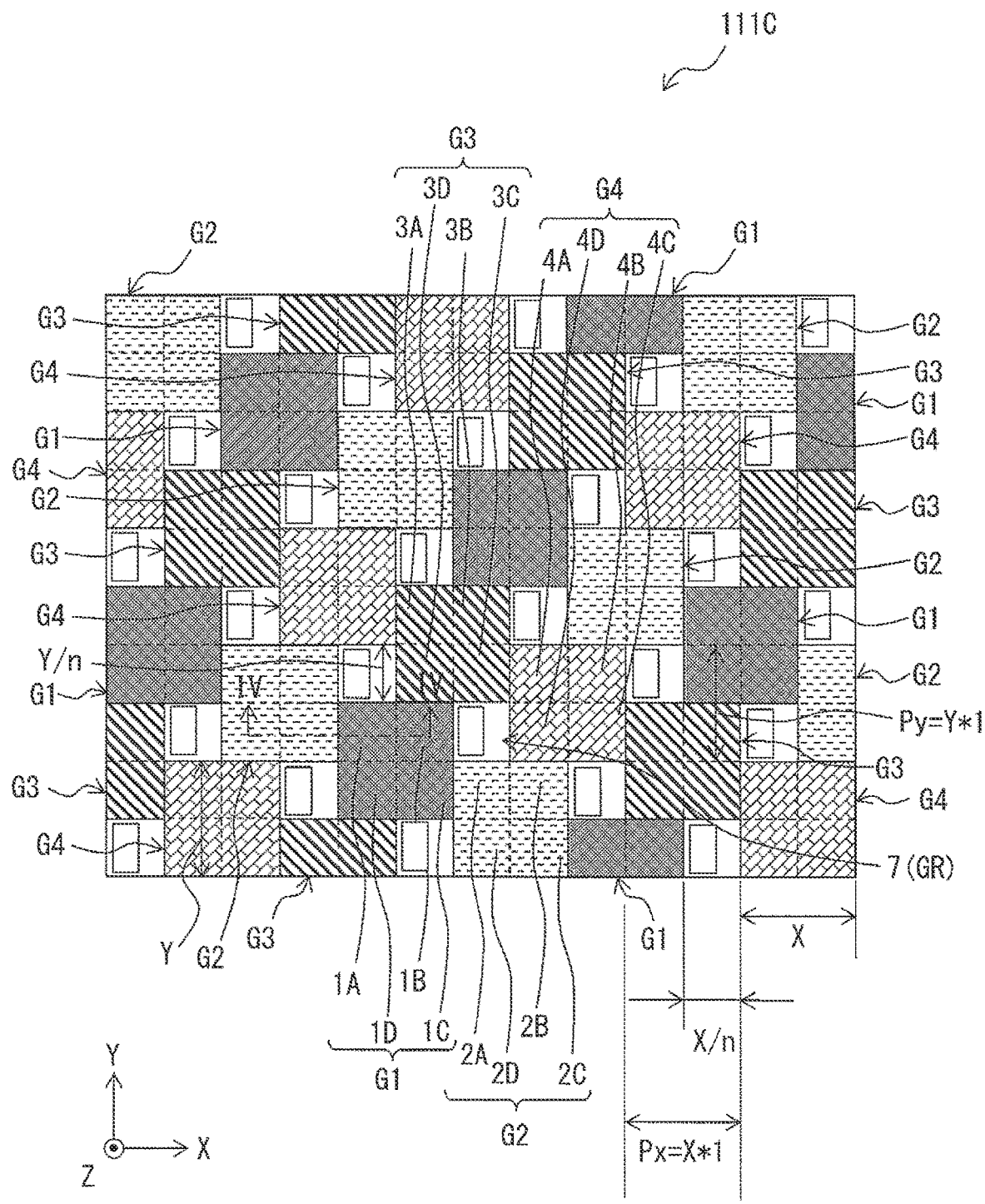
FIG. 7 is a plan view of a planar configuration example of a pixel array unit according to a third modification example of the present disclosure.

FIG. 7 is a schematic plan view of an entire configuration example of a pixel array unit 111C according to a third modification example of the embodiment of the present disclosure. In the pixel array unit 111C, an image plane phase detection pixel 7 is provided in the gap region GR. In a solid-state imaging element that includes the pixel array unit 111C having such a configuration, it is possible to detect a focal point of an object while achieving higher resolution.

(2.4)

Figure 8:
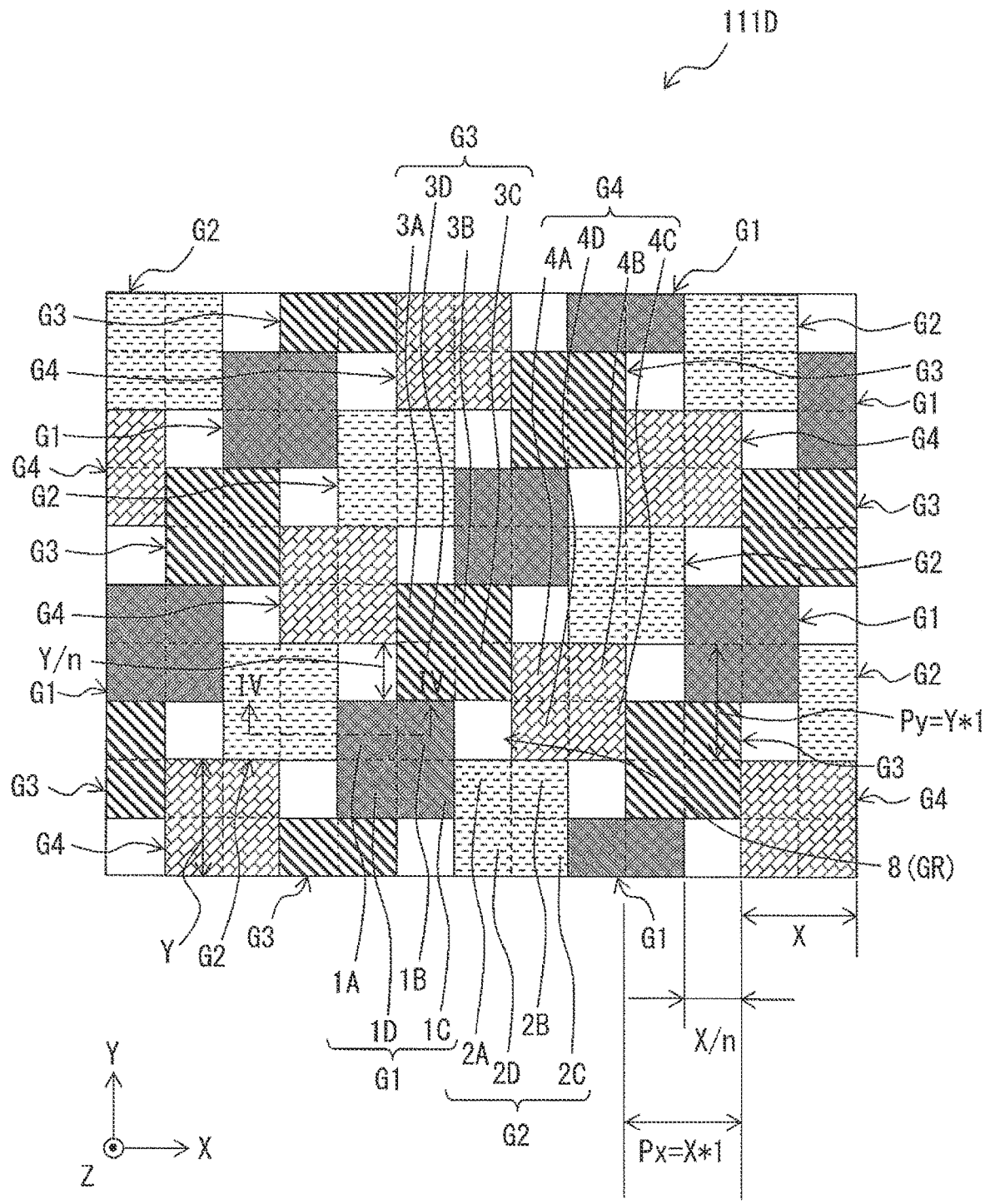
FIG. 8 is a plan view of a planar configuration example of a pixel array unit according to a fourth modification example of the present disclosure.

FIG. 8 is a schematic plan view of an entire configuration example of a pixel array unit 111D according to a fourth modification example of the embodiment of the present disclosure. In the pixel array unit 111D, a distance-measuring pixel 8 is provided in the gap region GR. In a solid-state imaging element that includes the pixel array unit 111D having such a configuration, it is possible to detect a distance to an object while achieving higher resolution.

3. Application Example to Electronic Apparatus

Figure 9:
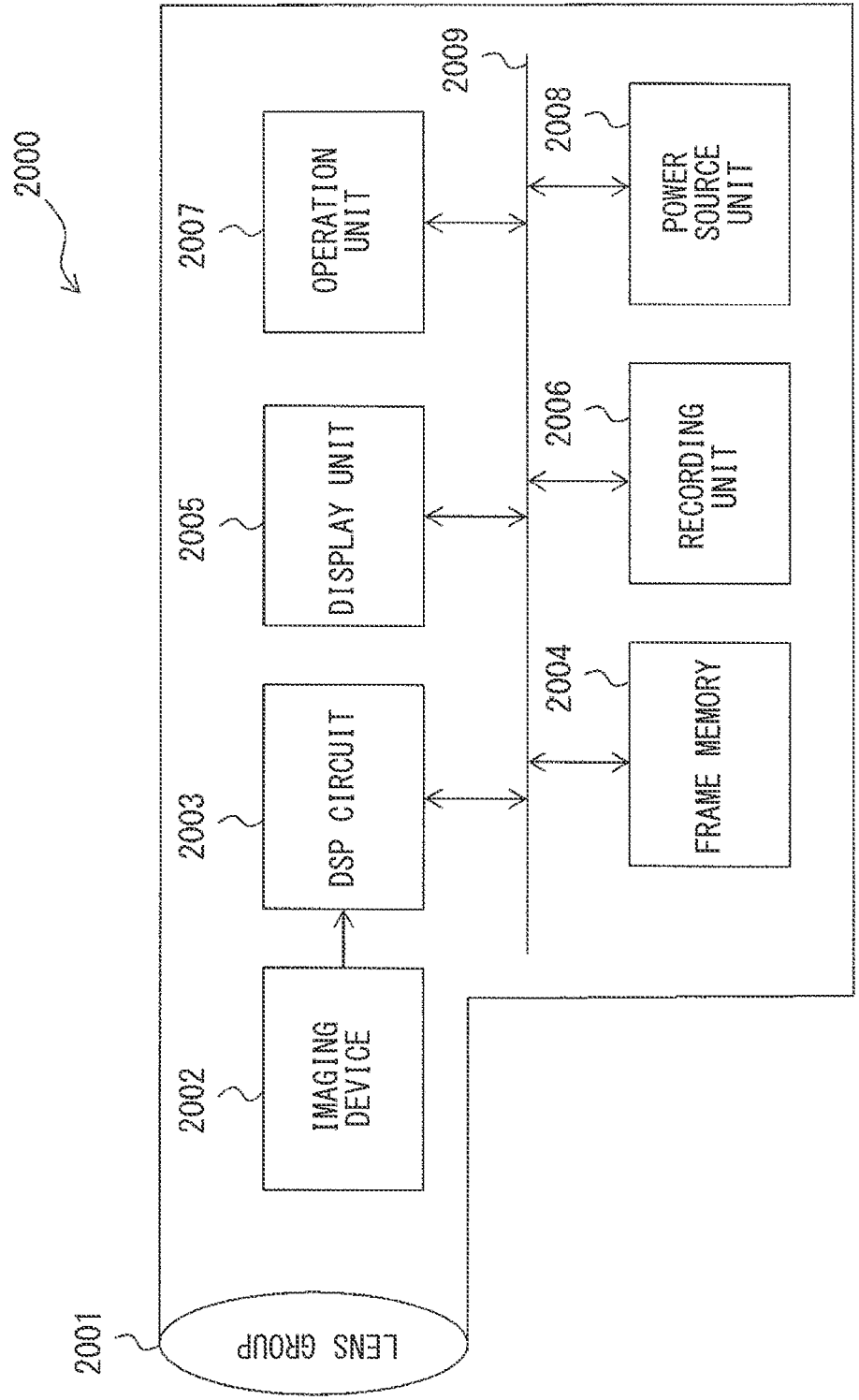
FIG. 9 is a schematic view of an entire configuration example of an electronic apparatus including the imaging element according to the embodiment of the present disclosure.

FIG. 9 is a block diagram illustrating a configuration example of a camera 2000 as an electronic apparatus to which the technology according to an embodiment of the present disclosure is applied.

The camera 2000 includes an optical unit 2001, an imaging device 2002, and a digital signal processor (DSP) circuit 2003. The optical unit 2001 includes a lens group and any other component. The foregoing imaging element 101 or any other imaging element (hereinafter referred to as "the solid-state imaging element 101, etc.") is applied to the imaging device 2002. The DSP circuit 2003 serves as a camera signal processing circuit. Moreover, the camera 2000 includes a frame memory 2004, a display unit 2005, a recording unit 2006, an operation unit 2007, and a power source unit 2008. The DSP circuit 2003, the frame memory 2004, the display unit 2005, the recording unit 2006, the operation unit 2007, and the power source unit 2008 are coupled to one another through a bath line 2009.

The optical unit 2001 takes light (image light) incident from an object, and forms an image of the light on an imaging surface of the imaging device 2002. The imaging device 2002 converts an amount of the light of which the image is formed on the imaging surface by the optical unit 2001 into an electrical signal on a pixel-by-pixel basis, and outputs the electrical signal as a pixel signal.

The display unit 2005 includes, for example, a panel display device such as a liquid crystal panel and an organic electroluminescence (EL) panel, and displays a moving image or a still image captured by the imaging device 2002. The recording unit 2006 records the moving image or the still image captured by the imaging device 2002 on a recording medium such as a hard disk and a semiconductor memory.

The operation unit 2007 provides an instruction for operation of various functions of the camera 2000 under an operation by a user. The power source unit 2008 appropriately supplies various kinds of power serving as operation power of the DSP circuit 2003, the frame memory 2004, the display unit 2005, the recording unit 2006, and the operation unit 2007 to the DSP circuit 2003, the frame memory 2004, the display unit 2005, the recording unit 2006, and the operation unit 2007.

As described above, it is expectable to obtain a favorable image with use of the foregoing solid-state imaging element 101, etc. as the imaging device 2002.

4. Further Application Example to Mobile Body

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body include an automobile, an electric vehicle, a hybrid electric vehicle, a motorcycle, a bicycle, any personal mobility device, an airplane, an unmanned aerial vehicle (drone), a vessel, and a robot.

Figure 10:
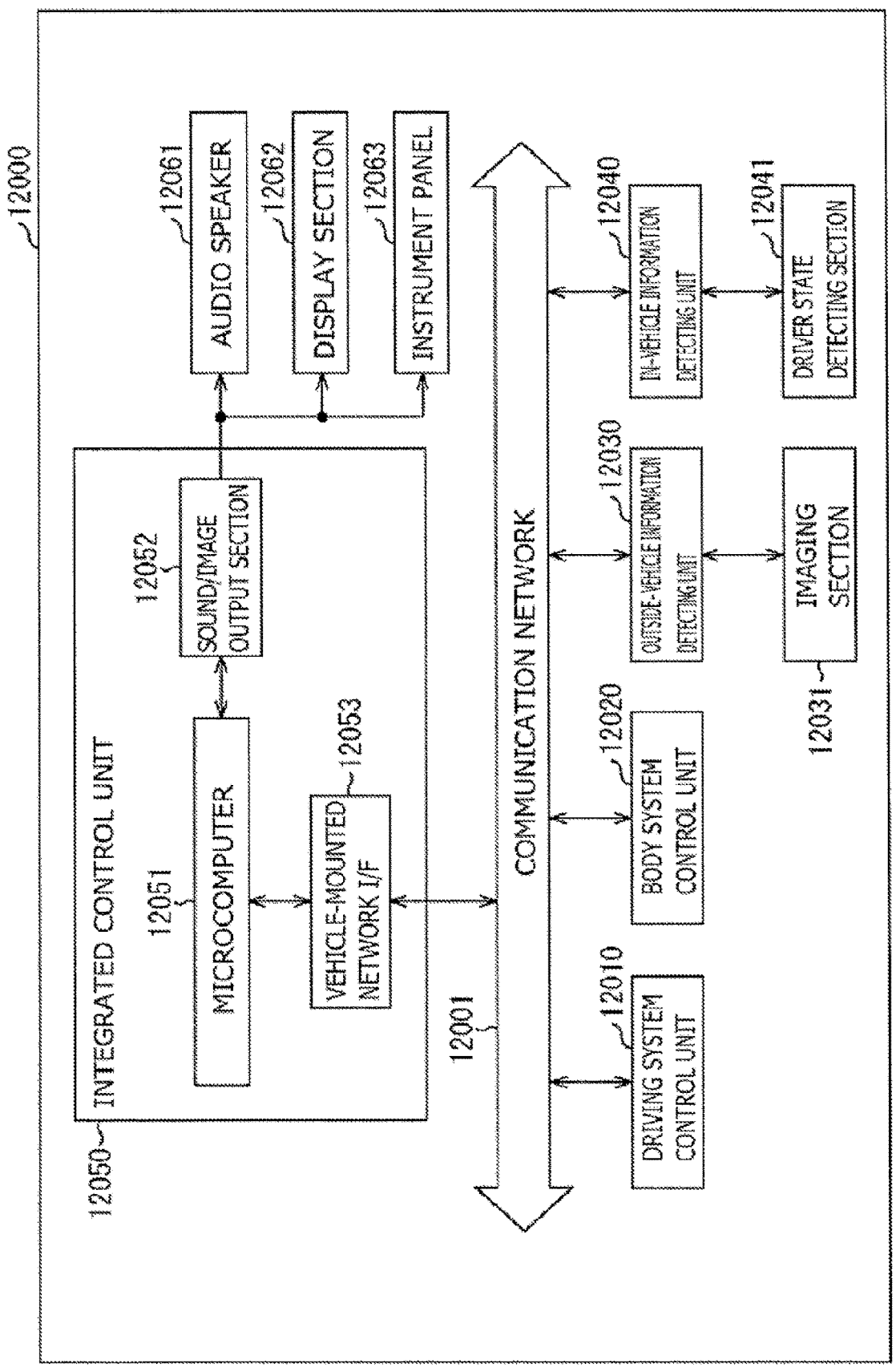
FIG. 10 is a block diagram depicting an example of schematic configuration of a vehicle control system.

FIG. 10 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 10, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent (or alternatively, reduce) glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 10, an audio speaker 12061, a display section 12062, and an instrument panel 12063 are illustrated as the output device. The display section 12062 may, for example, include at least one of an on-board display and a head-up display.

Figure 11:
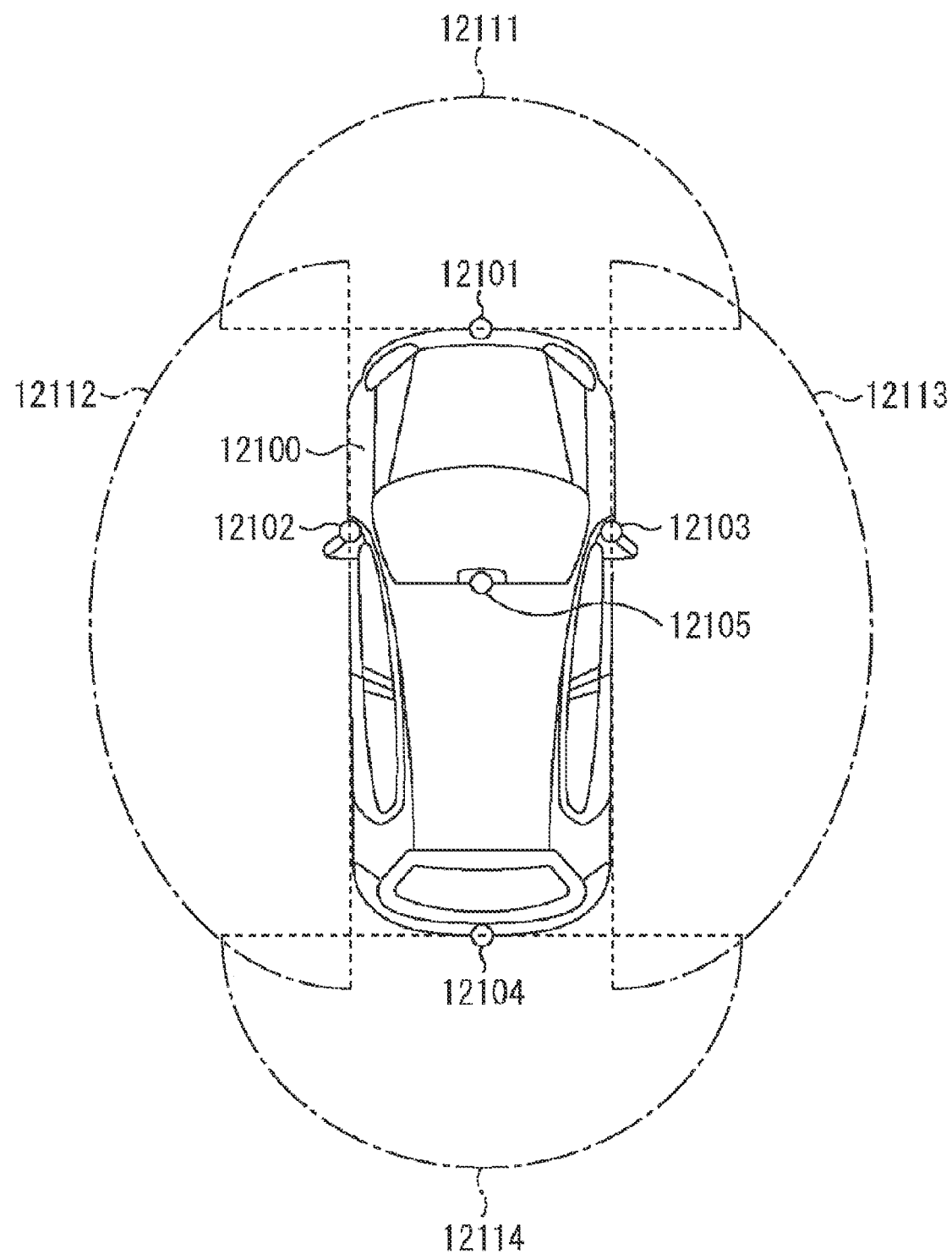
FIG. 11 is a diagram of assistance in explaining an example of installation positions of an outside-vehicle information detecting section and an imaging section.

FIG. 11 is a diagram depicting an example of the installation position of the imaging section 12031.

In FIG. 11, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 11 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to an embodiment of the present disclosure is applicable. The technology according to an embodiment of the present disclosure may be applied to, for example, the imaging section 12031 among components of the configuration described above. Specifically, the solid-state imaging device 101 or any other solid-state imaging device illustrated in FIG. 1 and other drawings may be applied to the imaging section 12031. A superior operation of the vehicle control system is expectable by application of the technology according to an embodiment of the present disclosure to the imaging section 12031.

5. Other Modification Examples

Although the description has been given with reference to some embodiments and some modification examples, the present disclosure is not limited thereto, and may be modified in a variety of ways. For example, in the foregoing embodiment, the case where one pixel group includes four pixels arranged in a two row-by-two column square arrangement, that is, the case of m=2 has been described as an example; however, in the present disclosure, m may be three or more. Moreover, in the foregoing embodiment and modification examples, the case where the first dimension in the first direction and the second dimension in the second direction in each of the pixel groups are substantially equal has been described as an example; however, in an embodiment of the present disclosure, the first dimension and the second dimension may be different from each other.

Further, in the foregoing embodiment and modification examples, a case where the imaging element outputs a color image has been described; however, an imaging element according to an embodiment of the present disclosure may output a monochrome image.

Furthermore, in the foregoing embodiment and modification examples, the case of n=2 has been exemplified in FIG. 3 and FIGS. 5 to 8, for example; however, m may be three or more in an embodiment of the present disclosure.

Moreover, in the foregoing embodiment and modification examples, in the case where attention is focused on a certain pixel group in the pixel array unit, other pixel groups are moved by X/n or Y/n toward the clockwise direction with the certain pixel group as a center; however, the present disclosure is not limited thereto. For example, in the case where attention is focused on the certain pixel group in the pixel array unit, other pixel groups may be moved by X/n or Y/n toward a counterclockwise direction with the certain pixel group as a center.

Figure 12:
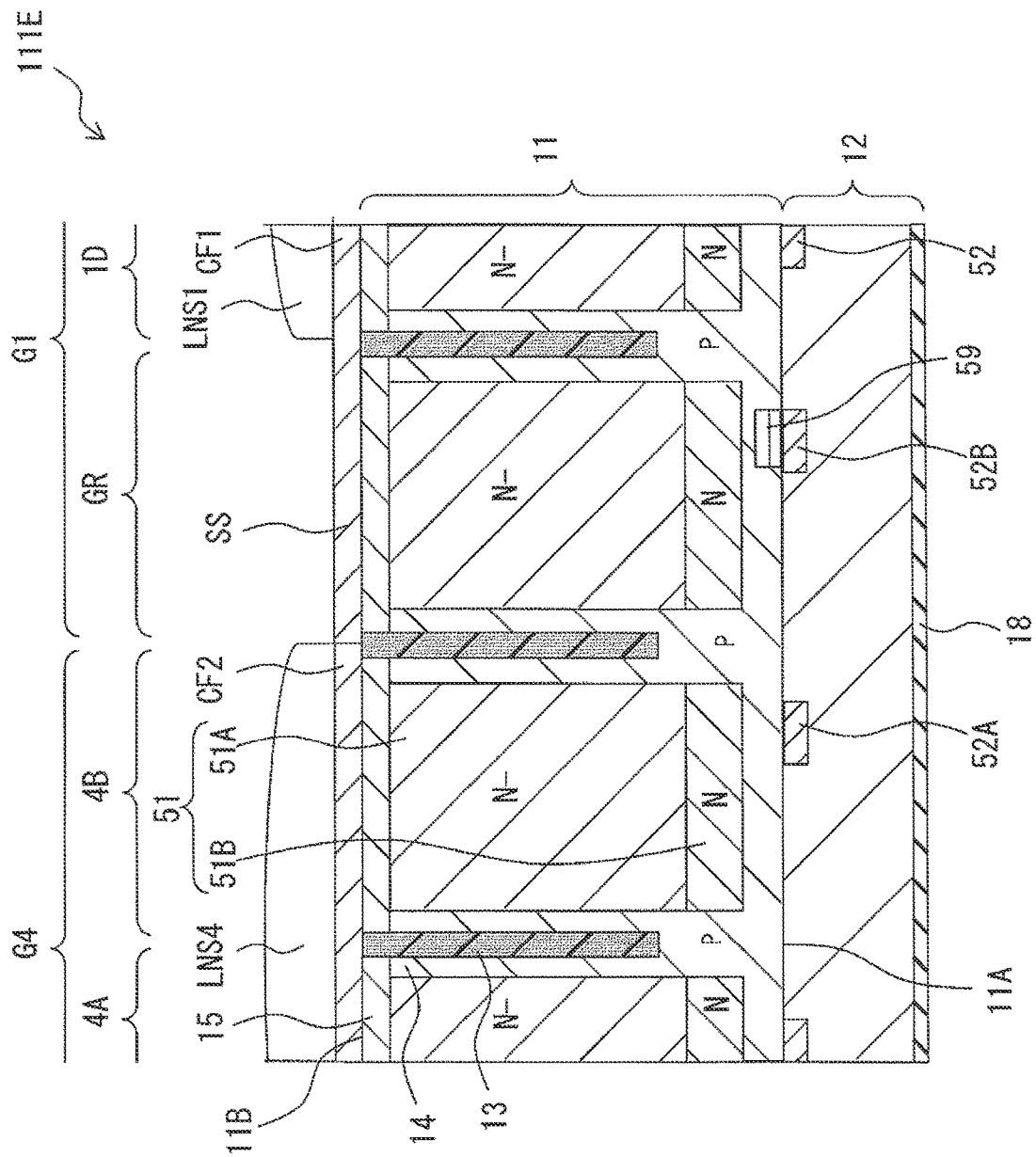
FIG. 12 is a partial cross-sectional view of a cross-sectional configuration example of a portion of a pixel array unit according to a fifth modification example of the present disclosure.

Further, in an imaging element according to an embodiment of the present disclosure, for example, as with a pixel array unit 111E according to a fifth modification example illustrated in FIG. 12, the MEM 59 in the pixel circuit may be disposed in the gap region GR. This makes it possible to increase an area in an XY plane of the MEM 59, as compared with a case where the MEM 59 is provided in a region superposed in a thickness direction on the PD 51, and to increase a capacity of the MEM 59. It is to be noted that it is sufficient if in place of the color filter CF, a light-blocking layer SS is provided in the gap region GR where the MEM 59 is provided.

Figure 13:
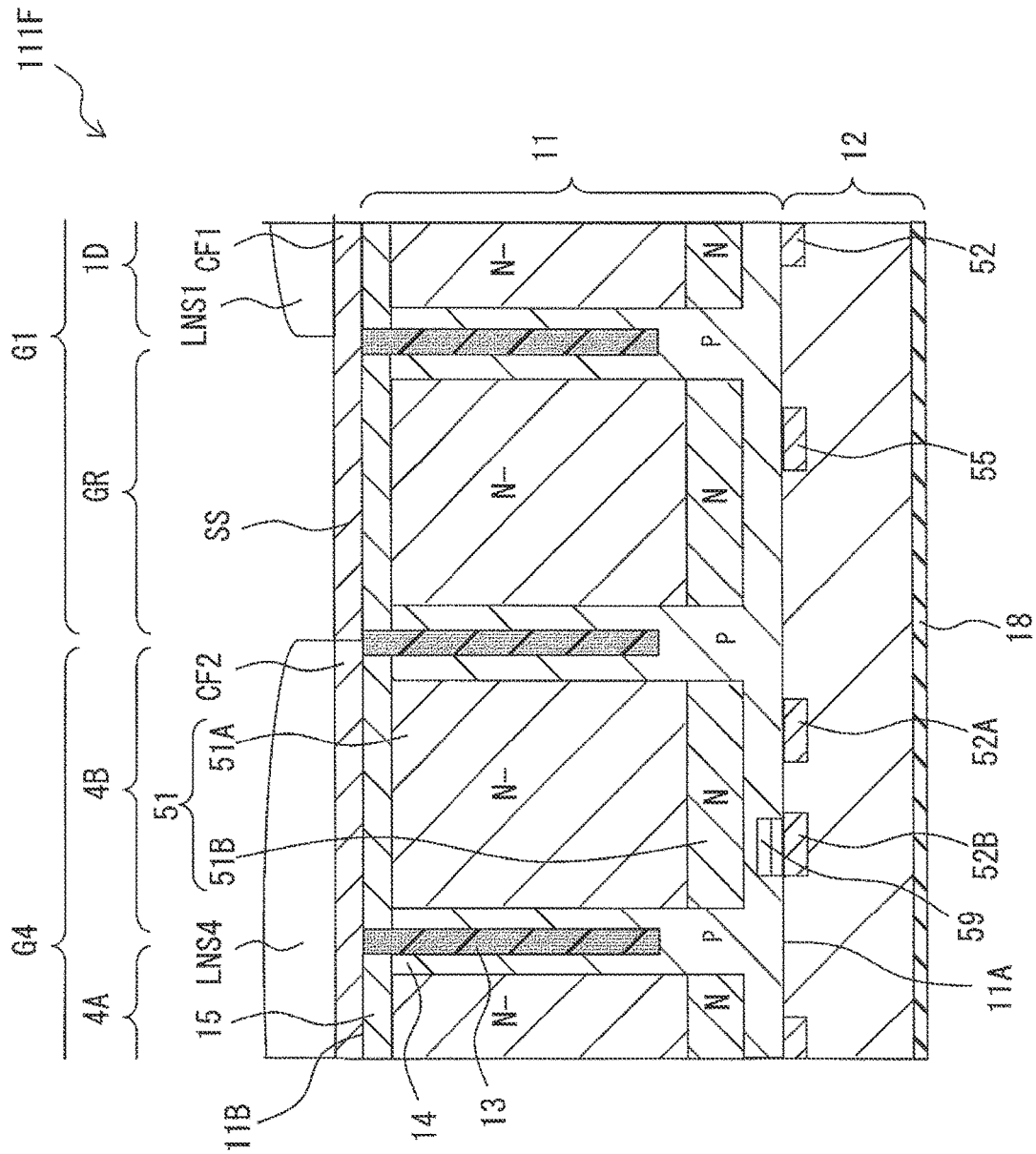
FIG. 13 is a partial cross-sectional view of a cross-sectional configuration example of a pixel array unit according to a sixth modification example of the present disclosure.

Furthermore, in an imaging element according to an embodiment of the present disclosure, for example, as with a pixel array unit 111F according to a sixth modification example illustrated in FIG. 13, the AMP 55 in the pixel circuit may be provided in the gap region GR. This makes it possible to increase an area in the XY plane of the AMP 55, as compared with the case where the AMP 55 is provided in a region superposed in the thickness direction on the PD 51, and to reduce random noise.

Figure 14:
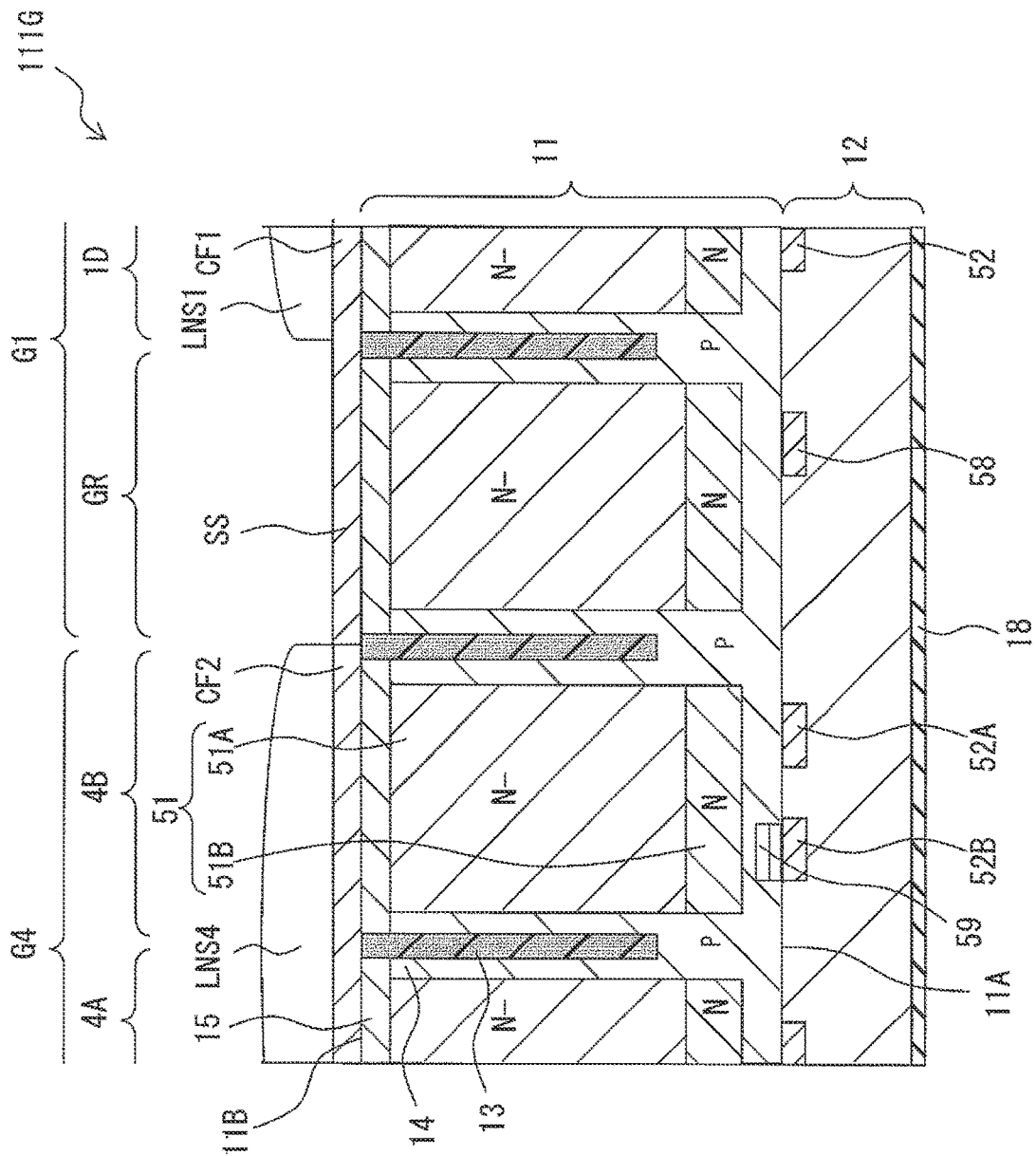
FIG. 14 is a partial cross-sectional view of a cross-sectional configuration example of a portion of a pixel array unit according to a seventh modification example of the present disclosure.

Moreover, in an imaging element according to an embodiment of the present disclosure, for example, as with a pixel array unit 111G according to a seventh modification example illustrated in FIG. 14, the OFG 58 in the pixel circuit may be provided in the gap region GR. This makes it possible to suppress blooming between different colors. It is to be noted that a configuration according to the sixth modification example illustrated in FIG. 13 and a configuration according to the seventh modification example illustrated in FIG. 14 may be combined.

Further, in the foregoing embodiment, the global shutter system solid-state imaging element has been described as an example; however, an imaging element according to an embodiment of the present disclosure is not limited thereto.

Figure 16:
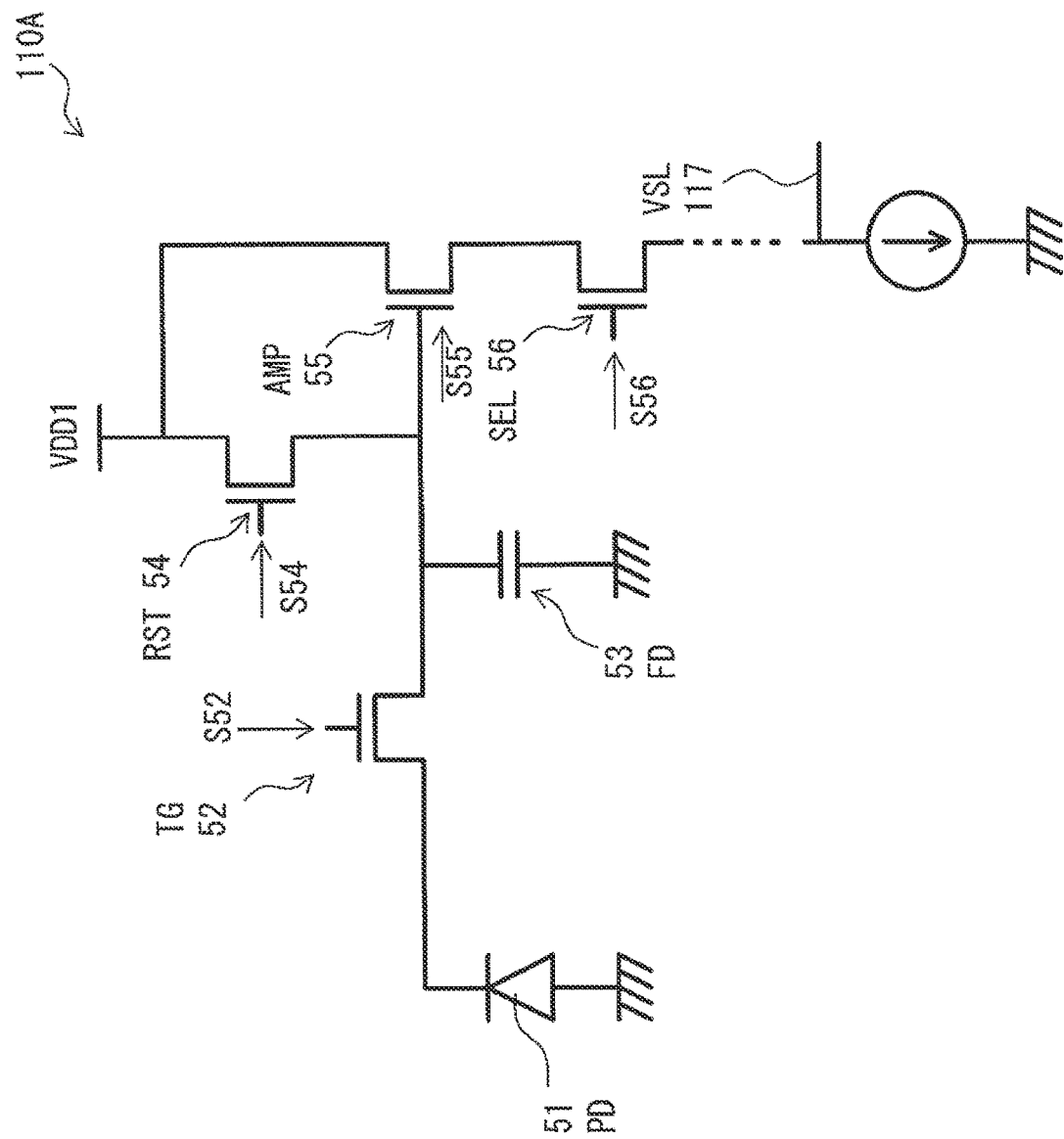
FIG. 16 is a circuit diagram illustrating a circuit configuration of a pixel array unit according to an eighth modification example of the present disclosure.
Figure 17:
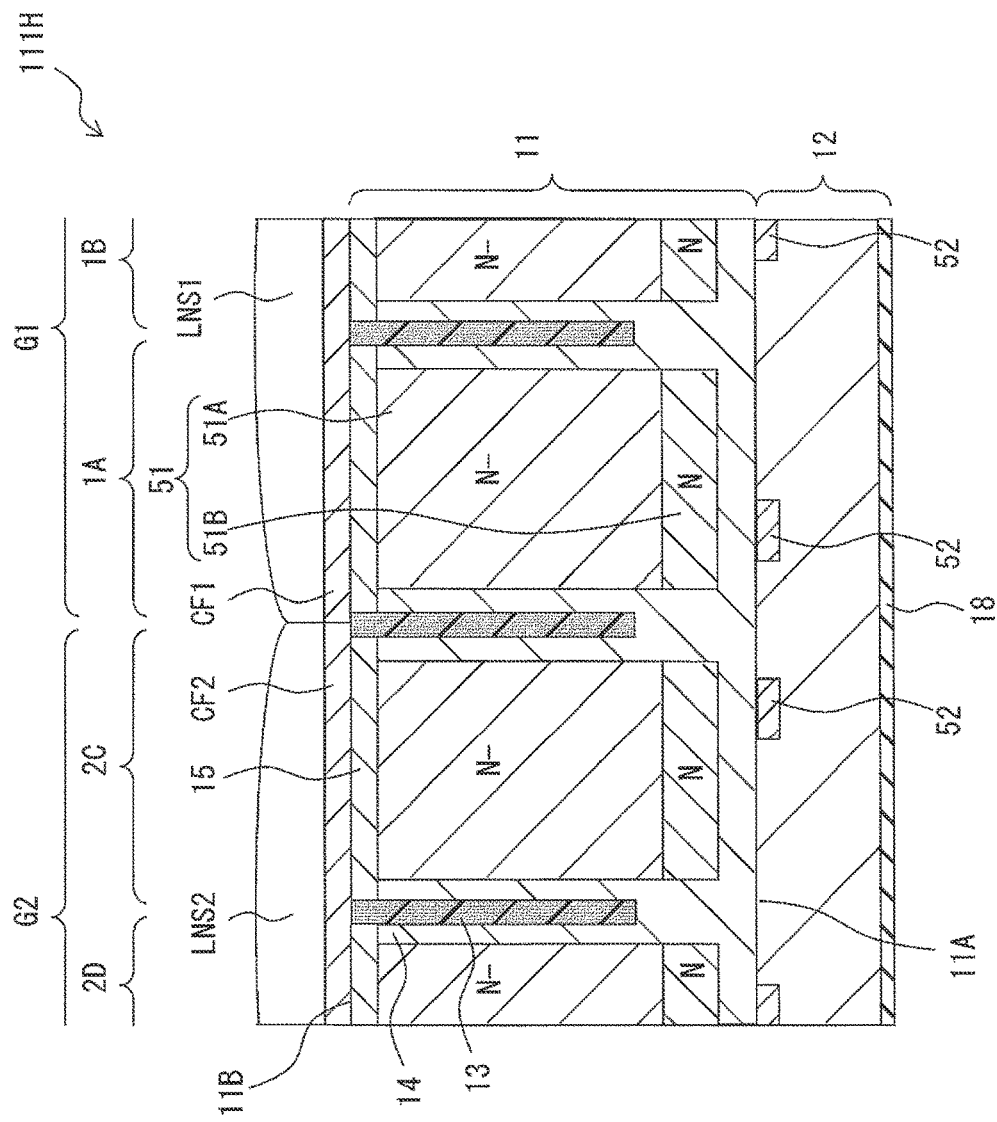
FIG. 17 is a partial cross-sectional view of a cross-sectional configuration example of a portion of the pixel array unit according to the eighth modification example of the present disclosure.

For example, as with a pixel circuit 110A and a pixel array unit 111H according to an eighth modification example illustrated in FIGS. 16 and 17, an imaging element according to an embodiment of the present disclosure may include one transfer transistor 52 in place of the TG 52A and the TG 52B, and may not include the MEM 59.

As described above, the imaging element and the electronic apparatus according to the embodiment of the present disclosure are suitable to enhance resolution. It is to be noted that the effects achieved by the present disclosure are not limited thereto, and may include any of effects described below. Moreover, the present technology may have the following configurations.

(1) An imaging device, comprising:
a first pixel group including:
first photoelectric conversion regions; and
at least one first color filter on the first photoelectric conversion regions;
a second pixel group including:
second photoelectric conversion regions; and
at least one second color filter on the second photoelectric conversion regions;
a dummy region between the first pixel group and the second pixel group in a first direction so that a first side of the dummy region is adjacent to the first pixel group and a second side of the dummy region is adjacent to the second pixel group.

(2)
The imaging device of (1), wherein the dummy region is a same size as one pixel in the first pixel group or the second pixel group.

(3)
The imaging device of one or more of (1) to (2), wherein the dummy region does not have a color filter.

(4)
The imaging device of one or more of (1) to (3), wherein the dummy region is an infrared detection region that detects infrared light, a phase difference detection region that detects a phase difference, or a distance detection region that detects distance.

(5)
The imaging device of one or more of (1) to (4), wherein the second pixel group is offset from the first pixel group in a second direction perpendicular to the first direction.

(6)
The imaging device of one or more of (1) to (5), wherein the second pixel group is offset from the first pixel group by a distance X/n, where X is a dimension of the first pixel group in the first direction and n is a natural number of at least two.

(7)
The imaging device of one or more of (1) to (6), wherein the first pixel group includes a first 2×2 array of pixels, and the second pixel group includes a second 2×2 array of pixels.

(8)
The imaging device of one or more of (1) to (7), further comprising:
a third pixel group adjacent to a third side of the dummy region, the third pixel group including;
third photoelectric conversion regions; and
at least one third color filter on the third photoelectric conversion regions; and
a fourth pixel group adjacent to a fourth side of the dummy region, the fourth pixel group including:
fourth photoelectric conversion regions; and
at least one fourth color filter on the fourth photoelectric conversion regions.

(9)
The imaging device of one or more of (1) to (8), wherein the first, second, third, and fourth pixel groups are arranged such that the dummy region is surrounded by the first, second, third, and fourth pixel groups.

(10)
The imaging device of one or more of (1) to (9), wherein the at least one third color filter and the at least one fourth color filter pass a same range of wavelengths of light.

(11)
The imaging device of one or more of (1) to (10), wherein the first side and the second side of the dummy region are opposite sides, and wherein the third side and the fourth side of the dummy region are opposite sides.

(12)
The imaging device of one or more of (1) to (11), wherein each pixel in the first, second, third, and fourth pixel groups includes a memory and a floating diffusion coupled to the memory.

(13)
The imaging device of one or more of (1) to (12), further comprising:
an isolation region between each pixel in the first and second pixel groups.

(14)
The imaging device of one or more of (1) to (13), wherein the first photoelectric conversion regions and the second photoelectric conversion regions are disposed in a substrate, and wherein the isolation region penetrates a first surface of the substrate and is surrounded by a portion of the substrate having a different conductivity type than the first and second photoelectric conversion regions.

(15)
An imaging device, comprising:
a dummy pixel;
a first pixel group;
a second pixel group;
a third pixel group; and
a fourth pixel group, wherein the first, second, third, and fourth pixel groups surround the dummy pixel.

(16)
The imaging device of one or more (15), wherein each of the first, second, third, and fourth pixel groups includes a 2×2 array of pixels.

(17)
The imaging device of one or more of (15) to (16), wherein each pixel group has a respective color filter that passes green, red, or blue light.

(18)
The imaging device of one or more of (15) to (17), wherein the dummy pixel does not have a color filter.

(19)
The imaging device of one or more of (15) to (18), further comprising:
a substrate including photoelectric conversion regions of each pixel;
a memory disposed in the substrate; and
a wiring layer on one side of the substrate and including at least one transistor coupled to the memory.

(20)
An imaging device, comprising:
a plurality of pixel groups; and
a plurality of dummy regions interspersed amongst the plurality of pixel groups such that each side of each dummy region is adjacent to one pixel in each pixel group.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1 to 4 first to fourth pixels
5 white pixel
6 near-infrared light detection pixel
7 image plane phase detection pixel
8 distance-measuring pixel
11 semiconductor substrate
12 wiring layer
13 element separator
14 P-type semiconductor region
15 fixed charge film
18 insulation layer
51 photoelectric converter (PD)
52A, 52B transfer transistor (TG)
53 charge-to-voltage converter (FD)
54 reset transistor (RST)
55 amplification transistor (AMP)
56 select transistor (SEL)
58 discharging transistor (OFG)
59 charge holding unit (MEM)
101 solid-state imaging element
110 sensor pixel
111 pixel array unit
112 vertical driver
113 column signal processor
114 horizontal driver
115 system controller
116 pixel drive line
117 vertical signal line (VSL)
118 signal processor
119 data storage unit
G1 to G4 first to fourth pixel groups
GR gap region

What is claimed is:

1. An imaging device, comprising:
a first pixel group including:
at least two first pixels;
first photoelectric conversion regions; and
at least one first color filter on the first photoelectric conversion regions;
a second pixel group including:
at least two second pixels;
second photoelectric conversion regions; and
at least one second color filter on the second photoelectric conversion regions; and
a dummy region provided between the first pixel group and the second pixel group in a first direction so that a first side of the dummy region is adjacent to the first pixel group and a second side of the dummy region is adjacent to the second pixel group,
wherein the dummy region has a same size as one of the at least two first pixels of the first pixel group or a same size as one of the at least two second pixels of the second pixel group,
wherein the first pixel group includes a first 2×2 array of pixels for the at least one first color filter and the second pixel group includes a second 2×2 array of pixels for that at least one second color filter, and
wherein the first pixel group and a fourth pixel group detect green light, the second pixel group detects red light, and a third pixel group detects blue light.

2. The imaging device of claim 1, wherein the dummy region does not have a color filter.

3. The imaging device of claim 1, wherein the dummy region is an infrared detection region that detects infrared light, a phase difference detection region that detects a phase difference, or a distance detection region that detects distance.

4. The imaging device of claim 1, wherein the second pixel group is offset from the first pixel group in a second direction perpendicular to the first direction.

5. The imaging device of claim 4, wherein the second pixel group is offset from the first pixel group by a distance X/n, where X is a dimension of the first pixel group in the first direction and n is a natural number of at least two.

6. The imaging device of claim 4, wherein the
third pixel group is adjacent to a third side of the dummy region, the third pixel group including:
third photoelectric conversion regions; and
at least one third color filter on the third photoelectric conversion regions; and
the fourth pixel group is adjacent to a fourth side of the dummy region, the fourth pixel group including:
fourth photoelectric conversion regions; and
at least one fourth color filter on the fourth photoelectric conversion regions.

7. The imaging device of claim 6, wherein the first, second, third, and fourth pixel groups are arranged such that the dummy region is surrounded by the first, second, third, and fourth pixel groups.

8. The imaging device of claim 7, wherein the at least one third color filter and the at least one fourth color filter pass a same range of wavelengths of light.

9. The imaging device of claim 8, wherein the first side and the second side of the dummy region are opposite sides, and wherein the third side and the fourth side of the dummy region are opposite sides.

10. The imaging device of claim 6, wherein each pixel in the first, second, third, and fourth pixel groups includes a memory and a floating diffusion coupled to the memory.

11. The imaging device of claim 10, further comprising:
an isolation region between each pixel in the first and second pixel groups.

12. The imaging device of claim 11, wherein the first photoelectric conversion regions and the second photoelectric conversion regions are disposed in a substrate, and wherein the isolation region penetrates a first surface of the substrate and is surrounded by a portion of the substrate having a different conductivity type than the first and second photoelectric conversion regions.

13. An imaging device, comprising:
a dummy pixel;
a first pixel group;
a second pixel group;
a third pixel group; and
a fourth pixel group,
wherein each of the first, second, third and fourth groups includes at least two pixels,
wherein the first, second, third, and fourth pixel groups surround the dummy pixel
wherein the dummy pixel has a same size as one of the at least two pixels of the first, second, third and fourth pixel groups, and
wherein the first pixel group includes a first 2×2 array of pixels and a first color filter, the second pixel group includes a second 2×2 array of pixels and a second color filter, the third pixel group includes a third 2×2 array of pixels and a third color filter and the fourth pixel group includes a fourth 2×2 array of pixels and a fourth color filter with the color filters arranged in a Bayer arrangement.

14. The imaging device of claim 13, wherein the color filters passes green, red, or blue light.

15. The imaging device of claim 14, wherein the dummy pixel does not have a color filter.

16. The imaging device of claim 13, further comprising:
a substrate including photoelectric conversion regions of each pixel;
a memory disposed in the substrate; and
a wiring layer on one side of the substrate and including at least one transistor coupled to the memory.

17. The imaging device of claim 13, wherein the dummy pixel is an infrared detection pixel that detects infrared light, a phase difference detection pixel that detects a phase difference, or a distance detection pixel that detects distance.

18. An imaging device, comprising:
a plurality of pixel groups,
wherein each of the plurality of pixel groups includes at least two pixels; and
a plurality of dummy regions interspersed amongst the plurality of pixel groups such that each side of each dummy region is adjacent to and has a same size as one pixel of the at least two pixels in each pixel group,
wherein each of the plurality of pixels groups includes a 2×2 array of pixels and a color filter, and
wherein the color filters are arranged in a Bayer arrangement.

19. The imaging device of claim 18, wherein the plurality of dummy regions does not have color filters.

20. The imaging device of claim 18, wherein each dummy region of the plurality of dummy regions is an infrared detection region that detects infrared light, a phase difference detection region that detects a phase difference, or a distance detection region that detects distance.

* * * * *